United States Patent
Kossakovski et al.

(10) Patent No.: US 10,170,811 B2
(45) Date of Patent: Jan. 1, 2019

(54) THERMOELECTRIC-BASED THERMAL MANAGEMENT OF ELECTRICAL DEVICES

(71) Applicant: Gentherm Incorporated, Northville, MI (US)

(72) Inventors: Dmitri Kossakovski, S. Pasadena, CA (US); Alfred Piggott, Redford, MI (US)

(73) Assignee: GENTHERM INCORPORATED, Northville, MI (US)

( * ) Notice: Subject to any disclaimer, the term of this patent is extended or adjusted under 35 U.S.C. 154(b) by 499 days.

(21) Appl. No.: 14/759,913

(22) PCT Filed: Jan. 13, 2014

(86) PCT No.: PCT/US2014/011339
§ 371 (c)(1),
(2) Date: Jul. 8, 2015

(87) PCT Pub. No.: WO2014/110524
PCT Pub. Date: Jul. 17, 2014

(65) Prior Publication Data
US 2015/0372356 A1    Dec. 24, 2015

Related U.S. Application Data

(60) Provisional application No. 61/752,353, filed on Jan. 14, 2013.

(51) Int. Cl.
*H01M 10/6572* (2014.01)
*H05K 7/20* (2006.01)
(Continued)

(52) U.S. Cl.
CPC ..... *H01M 10/6572* (2015.04); *H01M 10/486* (2013.01); *H01M 10/625* (2015.04);
(Continued)

(58) Field of Classification Search
None
See application file for complete search history.

(56) References Cited

U.S. PATENT DOCUMENTS

| | | |
|---|---|---|
| 3,561,224 A | 2/1971 | Banks et al. |
| 4,229,687 A | 10/1980 | Newman |

(Continued)

FOREIGN PATENT DOCUMENTS

| | | |
|---|---|---|
| CN | 100446339 | 12/2008 |
| CN | 101662054 | 3/2010 |

(Continued)

OTHER PUBLICATIONS

Full machine translation of JP 2008-047371, dated Feb. 2008.*
(Continued)

*Primary Examiner* — Jonathan Crepeau
(74) *Attorney, Agent, or Firm* — Knobbe, Martens, Olson & Bear, LLP

(57) ABSTRACT

Disclosed embodiments include thermoelectric-based thermal management systems and methods configured to heat and/or cool an electrical device. Thermal management systems can include at least one electrical conductor in electrical and thermal communication with a temperature-sensitive region of the electrical device and at least one thermoelectric device in thermal communication with the at least one electrical conductor. Electric power can be directed to the thermoelectric device by the same electrical conductor or an external power supply, causing the thermoelectric device to provide controlled heating and/or cooling to the electrical device via the at least one electrical conductor.

25 Claims, 23 Drawing Sheets

(51) Int. Cl.
  *H01M 10/48* (2006.01)
  *H01M 10/625* (2014.01)
  *H01M 10/633* (2014.01)

(52) U.S. Cl.
  CPC ............ *H01M 10/633* (2015.04); *H05K 7/20* (2013.01); *H01M 2220/20* (2013.01); *Y10T 29/49119* (2015.01)

(56) References Cited

U.S. PATENT DOCUMENTS

| | | | |
|---|---|---|---|
| 4,314,008 A | 2/1982 | Blake | |
| 4,324,845 A | 4/1982 | Stockel | |
| 4,444,851 A | 4/1984 | Maru | |
| 4,865,929 A | 9/1989 | Eck | |
| 4,999,576 A | 3/1991 | Levinson | |
| 5,015,545 A | 5/1991 | Brooks | |
| 5,071,652 A | 12/1991 | Jones et al. | |
| 5,121,047 A | 6/1992 | Goedken et al. | |
| 5,141,826 A | 8/1992 | Bohm et al. | |
| 5,197,291 A | 3/1993 | Levinson | |
| 5,229,702 A | 7/1993 | Boehling | |
| 5,395,708 A | 3/1995 | Hall | |
| 5,419,780 A | 5/1995 | Suski | |
| 5,592,363 A | 1/1997 | Atarashi et al. | |
| 5,623,195 A | 4/1997 | Bullock et al. | |
| 5,650,904 A | 7/1997 | Gilley et al. | |
| 5,871,859 A | 2/1999 | Parise | |
| 5,912,092 A | 6/1999 | Maruyama et al. | |
| 5,987,890 A | 11/1999 | Chiu et al. | |
| 6,050,326 A | 4/2000 | Evans | |
| 6,057,050 A | 5/2000 | Parise | |
| 6,082,445 A | 7/2000 | Dugan | |
| 6,094,919 A | 8/2000 | Bhatia | |
| 6,138,466 A | 10/2000 | Lake et al. | |
| 6,257,329 B1 | 7/2001 | Balzano | |
| 6,294,721 B1 | 9/2001 | Oravetz et al. | |
| 6,347,521 B1 | 2/2002 | Kadotani et al. | |
| 6,455,186 B1 | 9/2002 | Moores, Jr. et al. | |
| 6,464,027 B1 | 10/2002 | Dage et al. | |
| 6,570,362 B1 | 5/2003 | Estes et al. | |
| 6,588,217 B2 | 7/2003 | Ghoshal | |
| 6,598,403 B1 | 7/2003 | Ghoshal | |
| 6,645,666 B1 | 11/2003 | Moores, Jr. et al. | |
| 6,653,002 B1 | 11/2003 | Parise | |
| 6,705,089 B2 | 3/2004 | Chu et al. | |
| 6,767,666 B2 | 7/2004 | Nemoto | |
| 6,949,309 B2 | 9/2005 | Moores, Jr. et al. | |
| 6,959,555 B2 | 11/2005 | Bell | |
| 7,014,945 B2 | 3/2006 | Moores, Jr. et al. | |
| 7,056,616 B2 | 6/2006 | Moores, Jr. et al. | |
| 7,061,208 B2 | 6/2006 | Nishihata et al. | |
| 7,230,404 B2 | 6/2007 | Kimoto et al. | |
| 7,252,904 B2 | 8/2007 | Moores, Jr. et al. | |
| 7,270,910 B2 | 9/2007 | Yahnker et al. | |
| 7,326,490 B2 | 2/2008 | Moores, Jr. et al. | |
| 7,384,704 B2 | 6/2008 | Scott | |
| 7,531,270 B2 | 5/2009 | Buck et al. | |
| 7,592,776 B2 | 9/2009 | Tsukamoto et al. | |
| 7,603,205 B2 * | 10/2009 | Barry | H01L 23/3121 219/486 |
| 7,863,866 B2 | 1/2011 | Wolf | |
| 7,946,120 B2 | 5/2011 | Bell | |
| 8,163,647 B2 | 4/2012 | Kawabata et al. | |
| 8,492,642 B2 | 7/2013 | Kim | |
| 8,701,422 B2 | 4/2014 | Bell et al. | |
| 8,722,222 B2 | 5/2014 | Kossakovski et al. | |
| 8,841,015 B2 | 9/2014 | Yoon | |
| 8,915,091 B2 | 12/2014 | Goenka | |
| 8,974,942 B2 | 3/2015 | Bell et al. | |
| 9,590,282 B2 | 3/2017 | Kossakovski et al. | |
| 9,666,914 B2 | 5/2017 | Bell et al. | |
| 9,671,142 B2 | 6/2017 | Kossakovski et al. | |
| 9,899,711 B2 | 2/2018 | Piggott et al. | |
| 2006/0028182 A1 | 2/2006 | Yang et al. | |
| 2006/0093896 A1 | 5/2006 | Hong et al. | |
| 2006/0124165 A1 | 6/2006 | Bierschenk et al. | |
| 2006/0237730 A1 | 10/2006 | Abramov | |
| 2007/0193280 A1 | 8/2007 | Tuskiewicz et al. | |
| 2008/0239675 A1 | 10/2008 | Speier | |
| 2008/0311466 A1 | 12/2008 | Yang et al. | |
| 2010/0031987 A1 | 2/2010 | Bell et al. | |
| 2010/0104935 A1 | 4/2010 | Hermann et al. | |
| 2010/0112419 A1 | 5/2010 | Jang et al. | |
| 2010/0128439 A1 | 5/2010 | Tilak et al. | |
| 2010/0243346 A1 | 9/2010 | Anderson et al. | |
| 2011/0236731 A1 | 9/2011 | Bell et al. | |
| 2011/0244300 A1 | 10/2011 | Closek et al. | |
| 2012/0189902 A1 | 7/2012 | Kim | |
| 2012/0282497 A1 | 11/2012 | Yang et al. | |
| 2012/0285758 A1 | 11/2012 | Bell et al. | |
| 2013/0183566 A1 | 7/2013 | Wayne et al. | |
| 2013/0216887 A1 | 8/2013 | Wayne et al. | |
| 2014/0124176 A1 | 5/2014 | Zhamu et al. | |
| 2014/0331688 A1 | 11/2014 | Kossakovski et al. | |
| 2015/0244042 A1 | 8/2015 | Bell et al. | |
| 2015/0357692 A1 | 12/2015 | Piggott et al. | |
| 2016/0240903 A1 | 8/2016 | Kossakovski et al. | |
| 2017/0200992 A1 | 7/2017 | Piggott et al. | |
| 2017/0271728 A1 | 9/2017 | Kossakovski et al. | |
| 2017/0294692 A1 | 10/2017 | Bell et al. | |
| 2017/0314824 A1 | 11/2017 | Kossakovski et al. | |

FOREIGN PATENT DOCUMENTS

| | | |
|---|---|---|
| CN | 102769157 | 11/2012 |
| CN | 106030989 | 10/2016 |
| EP | 1 641 067 | 3/2006 |
| FR | 2 903 057 | 1/2008 |
| JP | 05-006687 | 1/1993 |
| JP | 06-207771 | 7/1994 |
| JP | 2003-007356 | 1/2003 |
| JP | 2003-217735 | 7/2003 |
| JP | 2005-057006 | 3/2005 |
| JP | 2008-047371 | 2/2008 |
| JP | 2008-091183 | 4/2008 |
| JP | 2008-108509 | 5/2008 |
| JP | 2008-166292 | 7/2008 |
| JP | 2008-218352 | 9/2008 |
| JP | 2008-226617 | 9/2008 |
| JP | 2009-170259 | 7/2009 |
| JP | 2009-181853 | 8/2009 |
| JP | 2009-245730 | 10/2009 |
| JP | 2010-108932 | 5/2010 |
| JP | 2010-113861 | 5/2010 |
| JP | 2010-198930 | 9/2010 |
| JP | 2011-023180 | 2/2011 |
| JP | 2012-079553 | 4/2012 |
| JP | 2012-156131 | 8/2012 |
| JP | 2012-174496 | 9/2012 |
| JP | 2012-216423 | 11/2012 |
| JP | 2012-234749 | 11/2012 |
| JP | 2016-540344 | 12/2016 |
| KR | 10-2008-0090162 | 10/2008 |
| WO | WO 2009/053858 | 4/2009 |
| WO | WO 2010/071463 | 6/2010 |
| WO | WO 2010/135371 | 11/2010 |
| WO | WO 2013/029744 | 3/2013 |
| WO | WO 2014/110524 | 7/2014 |
| WO | WO 2014/120688 | 8/2014 |
| WO | WO 2014/134369 | 9/2014 |
| WO | WO 2015/066079 | 5/2015 |
| WO | WO 2016/040872 | 3/2016 |

OTHER PUBLICATIONS

U.S. Appl. No. 15/595,756, filed May 15, 2017, Kossakovski et al.
Chako, Salvio et al., "Thermal modelling of Li-ion polymer battery for electric vehicle drive cycles", Journal of Power Sources, vol. 213, Sep. 2012, pp. 296-303.
U.S. Appl. No. 15/448,387, filed Mar. 2, 2017, Kossakovski et al.
U.S. Appl. No. 15/510,663, filed Mar. 10, 2017, Piggott et al.
U.S. Appl. No. 15/499,507, filed Apr. 27, 2017, Bell et al.

(56) References Cited

OTHER PUBLICATIONS

Behr, "Li-on Battery Cooling", Power Point Presentation, Stuttgart, May 20, 2009, 13 pages.
U.S. Appl. No. 14/760,680, filed Jul. 13, 2015, Piggott et al.
Behr, "Thermal Management for Hybrid Vehicles", Power Point Presentation, Technical Press Day 2009, 20 pages.
Esfahanian, Vahid et al., "Design and Simulation of Air Cooled Battery Thermal Management System Using Thermoelectric for a Hybrid Electric Bus", Proceedings of the FISITA 2012 World Automotive Congress, vol. 3, Lecture notes in Electrical Engineering, vol. 191, 2013.
Horie, et al., "A Study on an Advanced Lithium-ion Battery System for EVs", The World Electric Vehicle Journal, 2008, vol. 2, Issue 2, pp. 25-31.
International Search Report and Written Opinion re Application No. PCT/US2014/011339, dated Jun. 16, 2014.
International Preliminary Report on Patentability, re Application No. PCT/US2014/011339, dated Jul. 14, 2015.
Jeon et al., "Development of Battery Pack Design for High Power Li-Ion Battery Pack of HEV", The World Electric Vehicle Association Journal, 2007, vol. 1, pp. 94-99.
Jeon, et al., "Thermal modeling of cylindrical lithium ion battery during discharge cycle," Energy Conversion and Management, Aug. 2011, vol. 52, Issues 8-9, pp. 2973-2981.
Morawietz, et al., "Thermoelektrische Modellierung eines Lithium-Lonen-Energiespeichers fuer den Fahrzeugeinsatz," VDI-Berichte, Nov. 2008, Issue 2030, pp. 299-318.
Sabbah et al., "Passive Thermal Management System for Plug-in Hybrid and Comparison with Active Cooling: Limitation of Temperature Rise and Uniformity of Termperature Distribution," ECS Transactions, 13 (19) 41-52 (2008), The Electrochemical Society.
U.S. Appl. No. 15/867,126, filed Jan. 10, 2018, Piggott et al.

* cited by examiner

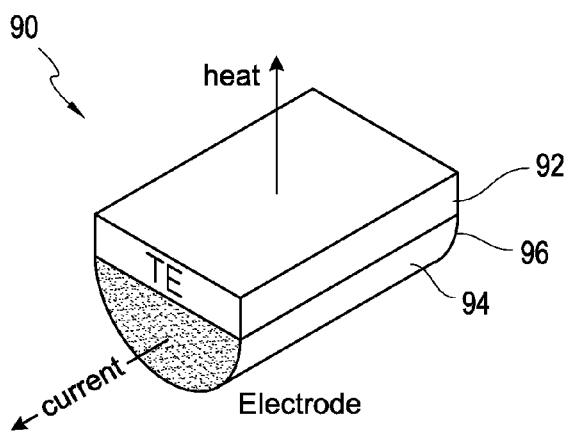
FIG. 9
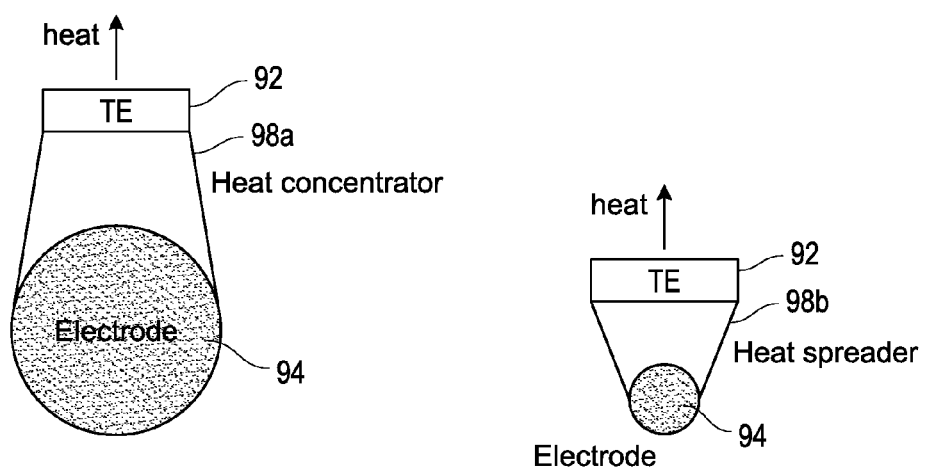
FIG. 10A                    FIG. 10B

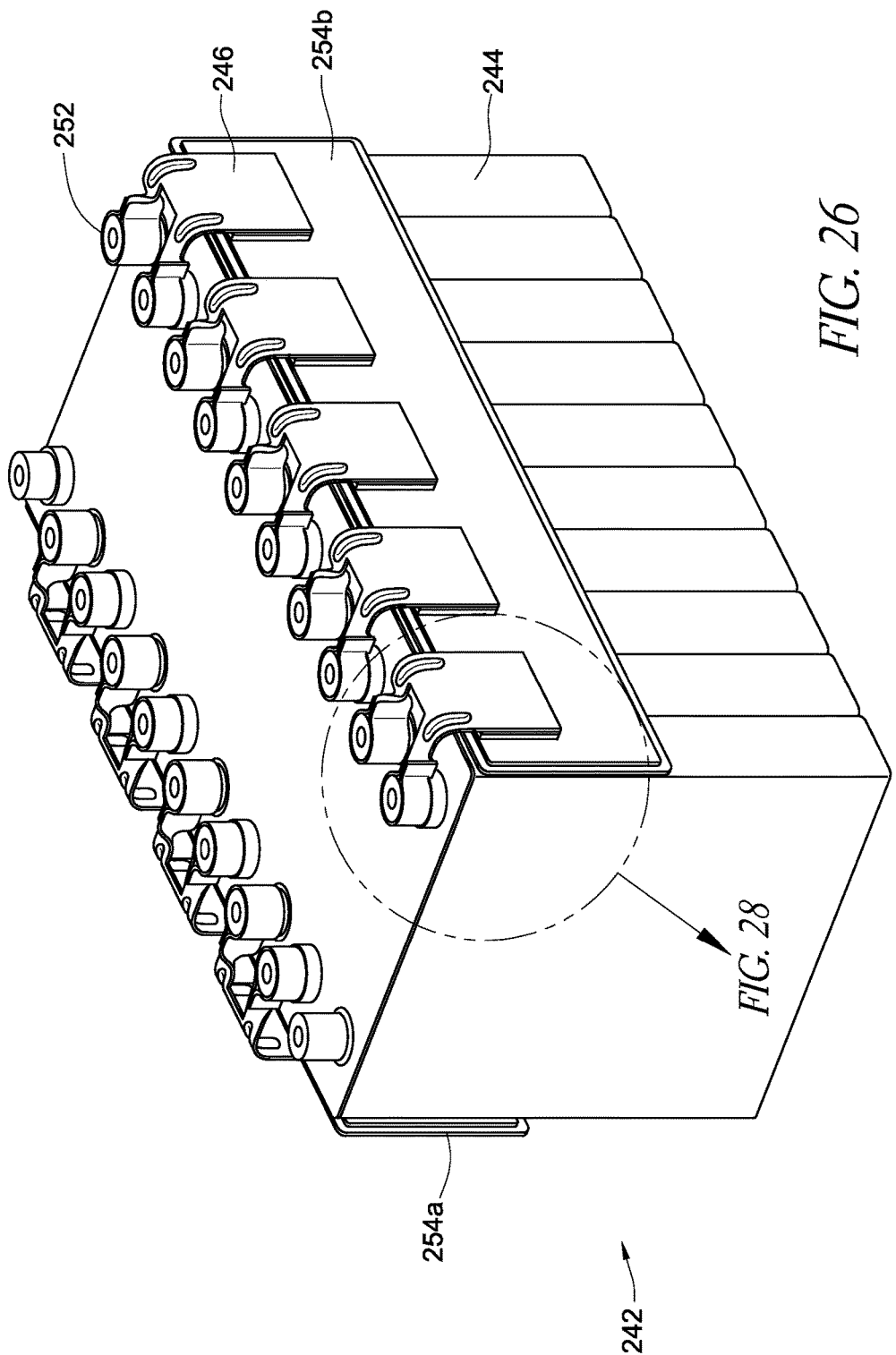

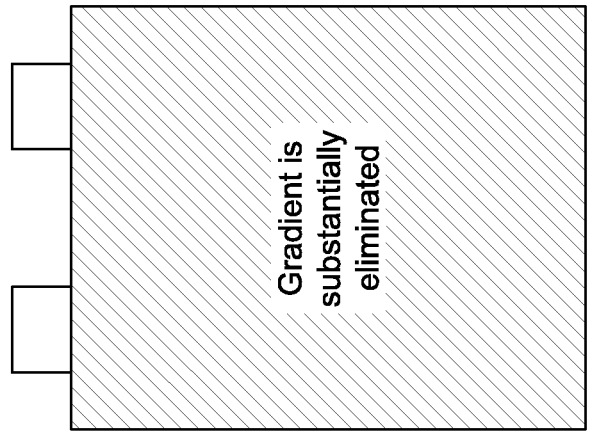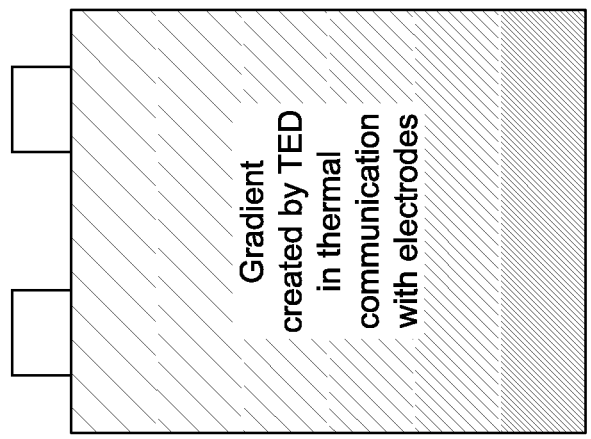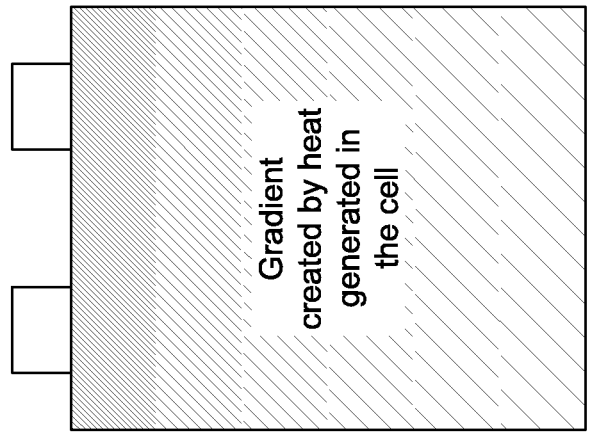
FIG. 30

THERMOELECTRIC-BASED THERMAL MANAGEMENT OF ELECTRICAL DEVICES

This application is the U.S. National Phase under 35 U.S.C. § 371 of International Application PCT/US2014/011339, filed Jan. 13, 2014, titled THERMOELECTRIC-BASED THERMAL MANAGEMENT OF ELECTRICAL DEVICES, which claims the benefit of U.S. Provisional Application No. 61/752,353, filed Jan. 14, 2013, titled THERMOELECTRIC-BASED THERMAL MANAGEMENT OF ELECTRICAL DEVICES, the entirety of each of which is incorporated herein by reference.

BACKGROUND

Field

This disclosure relates generally to thermoelectric (TE) cooling and heating of electrical devices.

Description of Related Art

Power electronics and other electrical devices, such as batteries, can be sensitive to overheating, cold temperatures, extreme temperatures, and operating temperature limits. The performance of such devices may be diminished, sometimes severely, when the devices are operated outside of recommended temperature ranges. In semiconductor devices, integrated circuit dies can overheat and malfunction. In batteries, including, for example, batteries used for automotive applications in electrified vehicles, battery cells and their components can degrade when overheated or overcooled. Such degradation can manifest itself in reduced battery storage capacity and/or reduced ability for the battery to be recharged over multiple duty cycles.

SUMMARY

It can be advantageous to manage the thermal conditions of power electronics and other electrical devices. Thermal management can reduce incidences of overheating, overcooling, and electrical device degradation. Certain embodiments described herein provide thermal management of devices that carry significant electric power and/or require high current and efficiency (e.g., power amplifiers, transistors, transformers, power inverters, insulated-gate bipolar transistors (IGBTs), electric motors, high power lasers and light-emitting diodes, batteries, and others). A wide range of solutions can be used to thermally manage such devices, including convective air and liquid cooling, conductive cooling, spray cooling with liquid jets, thermoelectric cooling of boards and chip cases, and other solutions. At least some embodiments disclosed herein provide at least one of the following advantages compared to existing techniques for heating or cooling electrical devices: higher power efficiency, lower or eliminated maintenance costs, greater reliability, longer service life, fewer components, fewer or eliminated moving parts, heating and cooling modes of operation, other advantages, or a combination of advantages.

In electrical devices, typically electrically active portions and/or temperature sensitive regions of the device are connected to the outside world, such as, for example, external circuits or devices, via electrical conductors. For example, electrodes of a battery cell can be designed to carry high electric power without significant losses (e.g., heat losses that are proportional to the square of the current, per Joule's Law). The wire gauge of the electrical conductors used for such electrodes is commensurate with the high current that typically flows in such devices. The larger the size of the battery is, the bigger are the electrode posts for connection with outside circuits.

The high electrical conductance of electrodes and many other types of electrical conductors also means that such conductors typically have high thermal conductivity. The high thermal conductivity can be used to solve various thermal management problems, where one can deliver desired thermal power (e.g., cooling, heating, etc.) directly to the sensitive elements of the device by heating and/or cooling the electrodes, bypassing thermally-insensitive elements of the device. Similar to using thermally conditioned blood during blood transfusions for delivering heat deep to the core of human bodies, heat pumping through the electrodes can be used to efficiently deliver desired thermal conditions deep inside an electrical device. As an example, it has been determined that electrode cooling of advanced automotive batteries is one of the most advantageous techniques for battery thermal management. For example, the electrodes can be cooled using solid, liquid, or air cooling techniques. In a sense, electrodes act as cold fingers in such a thermal management arrangement.

Embodiments disclosed herein include systems and methods capable of thermally managing an electrical device by applying direct or indirect thermoelectric (TE) cooling and/or heating to current carrying electrical conductors (e.g., electrodes) of power components, electronics, and other electrical devices. Such devices can often benefit from thermal management. Some embodiments will be described with reference to particular electrical devices, such as, for example, batteries. However, at least some embodiments disclosed herein are capable of providing thermal management to other electrical devices, such as, for example, insulated-gate bipolar transistors (IGBTs), other electrical devices, or a combination of devices. At least some such devices can have high current carrying capacity and can suffer from operation outside of a preferred temperature range. The operation of some embodiments is described with reference to a cooling mode of operation. However, some or all of the embodiments disclosed herein can have a heating mode of operation, as well. In some situations a heating mode of operation can be employed to maintain the temperature of an electrical device above a threshold temperature, under which the electrical device may degrade or exhibit impaired operation. TE devices are uniquely suited to provide both heating and cooling functions with minimum complications for system architecture.

Embodiments disclosed herein include thermoelectric-based thermal management systems and methods. In some embodiments, a thermal management system is configured to manage temperature in a temperature-sensitive region of an electrical device. The thermal management system can include a thermoelectric device configured to transfer thermal energy between a main surface and a waste surface upon application of electric power to the thermoelectric device. In some embodiments, the main surface of the thermoelectric device is in substantial thermal communication with a heat exchange surface of an electrical conductor. The electrical conductor is configured to deliver electric power to or from an electrical device such that the electrical conductor serves as a conduit for conducting thermal energy between a temperature-sensitive region of the electrical device and the thermoelectric device.

In certain embodiments, a method for thermally managing an electrical device includes connecting a heat transfer device that comprises an electrically conductive portion and an electrically insulating portion to a plurality of electrical conductors of an electrical device. The method can include directing substantial thermal energy exchange between the heat transfer device and a main surface of a thermoelectric device.

In some embodiments, a method for thermally managing an electrical device includes establishing substantial thermal communication between a thermoelectric device and a heat exchange surface of an electrical conductor that is in thermal and electrical communication with the electrical device. The method can include heating or cooling the electrical device by adjusting the current directed in or out of the thermoelectric device.

In some embodiments, a thermal management system is provided that is configured to manage temperature in a temperature-sensitive region of an electrical device. The system includes a thermoelectric device configured to transfer thermal energy between a main surface and a waste surface upon application of electric power to the thermoelectric device, wherein the main surface of the thermoelectric device is in substantial thermal communication with an electrical conductor. The electrical conductor is configured to deliver electric power to or from an electrical device, and is capable of serving as a conduit for conducting thermal energy between a temperature-sensitive region of the electrical device and the thermoelectric device. The system includes a controller comprising a control algorithm configured to monitor a thermal gradient created during operation of the electrical device across the temperature sensitive region and to adjust electric power delivered to the thermoelectric device such that the thermal energy transferred to or away from the temperature-sensitive region of the electrical device reduces or eliminates the thermal gradient created during operation of the electrical device across the temperature sensitive region.

In some embodiments, the thermal management system includes a sensor in thermal communication with the electrical device and in electrical communication with the controller. The controller is configured to monitor an input from the sensor and electric current directed in or out of the electrical device under thermal management and adjust electric power delivered to the thermoelectric device to reduce or eliminate the thermal gradient created during operation of the electrical device across the temperature sensitive region.

In some embodiments, the electric power delivered to the thermoelectric device in response to the input to reduce or eliminate the thermal gradient created during operation of the electrical device across the temperature sensitive region is adjusted between two or more nonzero levels of electric power.

In some embodiments, the control algorithm is further configured to monitor a thermal gradient produced as a result of the thermal energy transferred to or away from the temperature sensitive region of the electrical device and to adjust electric power delivered to the thermoelectric device such that the thermal gradient produced as a result of the thermal energy transferred to or away from the temperature sensitive region of the electrical device reduces or eliminates the thermal gradient created during operation of the electrical device across the temperature sensitive region.

In some embodiments, the thermoelectric device comprises a first operating mode and a second operating mode. In the first operating mode, the thermoelectric device is configured to transfer a maximum amount of thermal energy allowed by the thermoelectric device. In the second operating mode, the thermoelectric device is configured to transfer an amount of thermal energy such that the thermal gradient created by the transfer of thermal energy balances with the thermal gradient created during operation of the electrical device across the temperature sensitive region to reduce or eliminate a resultant thermal gradient across the temperature sensitive region.

In some embodiments, an input configured to be monitored by the controller comprises at least one of: temperature of the electrical device, charge state of the electrical device, health of the electrical device, voltage of the electrical device, resistance of the electrical device, current of the electrical device, load on the electrical device, temperature of an environment, weather forecast, time of day, terrain information, and geometry of the temperature sensitive region.

In some embodiments, the controller is integrated with a battery management system configured to administer control functions to a battery pack.

In some embodiments, the electrical device is a battery, and the temperature sensitive region is a cell of the battery.

In some embodiments, a resultant thermal gradient across the temperature sensitive region of the electrical device is reduced to less than or equal to about 10 degrees C. In some embodiments, the thermoelectric device is powered by the electrical device.

In some embodiments, a method for thermally managing an electrical device includes establishing substantial thermal communication between a thermoelectric device and an electrical conductor that is in thermal and electrical communication with a temperature sensitive region of an electrical device. The method includes monitoring an input from a temperature sensor in thermal communication with the temperature-sensitive region of the electrical device and electrical communication with a controller that includes a control algorithm provided to monitor the input. The input includes a thermal gradient created during operation of the electrical device across the temperature sensitive region. The method includes adjusting the current directed in or out of the thermoelectric device in response to the input to reduce or eliminate a thermal gradient created during operation of the electrical device across the temperature sensitive region.

In some embodiments, adjusting the current directed in or out of the thermoelectric device in response to the input to reduce or eliminate a thermal gradient created during operation of the electrical device across the temperature-sensitive region comprises adjusting the current between two or more nonzero levels.

In some embodiments, the control algorithm is configured to monitor a thermal gradient produced as a result of the thermal energy transferred to or away from the temperature sensitive region of the electrical device and to adjust current delivered to the thermoelectric device such that the thermal gradient produced as a result of the thermal energy transferred to or away from the temperature sensitive region of the electrical device combines with the thermal gradient created during operation of the electrical device across the temperature sensitive region such that a resulting thermal gradient of the electrical device is eliminated or reduced.

In some embodiments, the method further includes operating the thermoelectric device in a first mode and a second mode. In the first mode, the thermoelectric device is configured to transfer a maximum amount of thermal energy allowed by the thermoelectric device. In the second operating mode, the thermoelectric device is configured to transfer an amount of thermal energy such that the thermal gradient created by the transfer of thermal energy balances with the thermal gradient created during operation of the electrical device across the temperature sensitive region to reduce or eliminate a resultant thermal gradient across the temperature sensitive region.

In some embodiments, an input configured to be monitored by the controller comprises at least one of: temperature of the electrical device, charge state of the electrical device, health of the electrical device, voltage of the electrical device, resistance of the electrical device, current of the electrical device, load on the electrical device, temperature of an environment, weather forecast, time of day, terrain information, and geometry of the temperature sensitive region.

In some embodiments, the controller is integrated with a battery management system configured to administer control functions to a battery pack.

In some embodiments, the electrical device is a battery, and the temperature sensitive region is a cell of the battery.

In some embodiments, the thermal gradient across the temperature sensitive region of the electrical device is reduced to less than or equal to about 10 degrees C.

In some embodiments, the thermoelectric device is powered by the electrical device.

In some embodiments, a method of manufacturing a thermal management system for thermally managing an electrical device is provided that includes connecting a thermoelectric device to an electrical conductor that is in thermal and electrical communication with a temperature sensitive region of an electrical device. The method includes positioning a sensor on the electrical device such that the sensor is capable of measuring an input comprising a thermal gradient of the temperature sensitive region of the electrical device. The method includes connecting the sensor to a control system comprising a control algorithm configured to adjust electric power delivered to the thermoelectric device in response to the input from the sensor such that thermal energy transferred to or away from the temperature sensitive region of the electrical device reduces or eliminates a thermal gradient created during operation of the electrical device across the temperature sensitive region.

In some embodiments, the control algorithm is further configured to monitor a thermal gradient produced as a result of the thermal energy transferred to or away from the temperature sensitive region of the electrical device and to adjust electric power delivered to the thermoelectric device such that the thermal gradient produced as a result of the thermal energy transferred to or away from the temperature sensitive region of the electrical device combines with the thermal gradient created during operation of the electrical device across the temperature sensitive region such that a resulting thermal gradient of the electrical device is eliminated or reduced.

In some embodiments, the input from the sensor comprises at least one of: temperature of the electrical device, charge state of the electrical device, health of the electrical device, voltage of the electrical device, resistance of the electrical device, current of the electrical device, load on the electrical device, temperature of an environment, weather forecast, time of day, terrain information, and geometry of the temperature sensitive region.

In some embodiments, the method includes integrating the control system with a battery management system configured to administer control functions to a battery pack In some embodiments, the electrical device is a battery, and the temperature sensitive region is a cell of the battery.

In some embodiments, the thermal gradient across the temperature sensitive region of the electrical device is reduced to less than or equal to about 10 degrees C.

In some embodiments, the thermoelectric device is configured to be powered by the electrical device.

BRIEF DESCRIPTION OF THE DRAWINGS

Various embodiments are depicted in the accompanying drawings for illustrative purposes, and should in no way be interpreted as limiting the scope of the thermoelectric assemblies or systems described herein. In addition, various features of different disclosed embodiments can be combined with one another to form additional embodiments, which are part of this disclosure. Any feature or structure can be removed, altered, or omitted. Throughout the drawings, reference numbers may be reused to indicate correspondence between reference elements.

FIG. 9 is a cross-sectional perspective view of an electrical conductor in thermal communication with a TE device.

FIG. 10A is a cross-sectional view of a thermal management system with a heat concentrator.

FIG. 10B is a cross-sectional view of a thermal management system with a heat spreader.

FIG. 26 is a perspective view of another example thermal management system.

FIG. 30 schematically illustrates simplified views of an example battery cell having a reduced thermal gradient due to the net effect of combining thermal gradients produced due to the operation and thermal management of the battery cell.

DETAILED DESCRIPTION

Figure 1A:
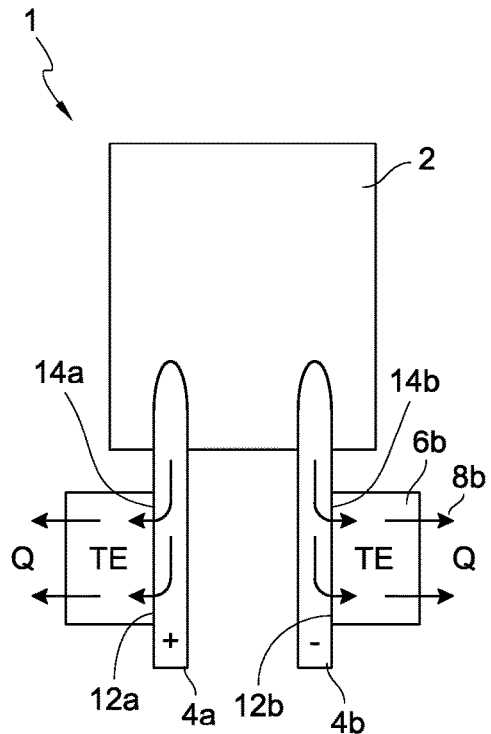
FIGS. 1A and 1B schematically illustrate examples of a thermal management system with multiple TE devices, where each of the TE devices is in thermal communication with an electrical conductor of an electrical device.

Although certain embodiments and examples are disclosed herein, the subject matter extends beyond the examples in the specifically disclosed embodiments to other alternative embodiments and/or uses, and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

It can be advantageous to manage the thermal conditions of electronics and electrical devices. Such thermal management can reduce incidences of overheating, overcooling, and electrical device degradation. Certain embodiments described herein provide thermal management of devices that carry significant electric power and/or require high current and efficiency (e.g., power amplifiers, transistors, transformers, power inverters, insulated-gate bipolar transistors (IGBTs), electric motors, high power lasers and light-emitting diodes, batteries, and others). A wide range of solutions can be used to thermally manage such devices, including convective air and liquid cooling, conductive cooling, spray cooling with liquid jets, thermoelectric cooling of boards and chip cases, and other solutions. At least some embodiments disclosed herein provide at least one of the following advantages compared to existing techniques for heating or cooling electrical devices: higher power efficiency, lower or eliminated maintenance costs, greater reliability, longer service life, fewer components, fewer or eliminated moving parts, heating and cooling modes of operation, other advantages, or a combination of advantages.

In electrical devices, typically electrically active portions and/or temperature sensitive regions of the device are connected to the outside world, such as, for example, external circuits or devices, via electrical conductors. For example, electrodes of a battery cell can be designed to carry high electric power without significant losses (e.g., heat losses that are proportional to the square of the current, per Joule's Law). The wire gauge of the electrical conductors used for such electrodes is commensurate with the high current that typically flows in such devices. The larger the size of the battery is, the bigger are the electrode posts for connection with the outside circuits.

The high electrical conductance of electrodes and many other types of electrical conductors also means that such conductors typically have high thermal conductivity. The high thermal conductivity can be used to solve various thermal management problems, where one can deliver desired thermal power (e.g., cooling, heating, etc.) directly to the sensitive elements of the device by heating and/or cooling the electrodes, bypassing thermally-insensitive elements of the device. Similar to using thermally conditioned blood during blood transfusions for delivering heat deep to the core of human bodies, heat pumping through the electrodes can be used to efficiently deliver desired thermal conditions deep inside an electrical device. As an example, it has been determined that electrode cooling of advanced automotive batteries is one of the most advantageous techniques for battery thermal management. For example, the electrodes can be cooled using solid, liquid, or air cooling techniques. In a sense, electrodes act as cold fingers in such a thermal management arrangement.

Embodiments disclosed herein include systems and methods capable of thermally managing an electrical device by applying direct or indirect thermoelectric (TE) cooling and/or heating to current carrying electrical conductors (e.g., electrodes) of power components, electronics, and other electrical devices. Such devices can often benefit from thermal management. Some embodiments will be described with reference to particular electrical devices, such as, for example, batteries. However, at least some embodiments disclosed herein are capable of providing thermal management to other electrical devices, such as, for example, insulated-gate bipolar transistors (IGBTs), other electrical devices, or a combination of devices. At least some such devices can have high current carrying capacity and can suffer from operation outside of a preferred temperature range. The operation of some embodiments is described with reference to a cooling mode of operation. However, some or all of the embodiments disclosed herein can have a heating mode of operation, as well. In some situations a heating mode of operation can be employed to maintain the temperature of an electrical device above a threshold temperature, under which the electrical device may degrade or exhibit impaired operation. TE devices are uniquely suited to provide both heating and cooling functions with minimum complications for system architecture.

There are a variety of ways in which TE devices can be used for electrical conductor cooling and/or heating tasks. As described herein, TE devices can include one or more TE elements, TE assemblies and/or TE modules. In some embodiments, a TE system can include a TE device, which comprises a first side and a second side opposite the first side. In some embodiments, the first side and second side can be a main surface and waste surface or heating surface and cooling surface. A TE device can be operably coupled with a power source. The power source can be configured to apply a voltage to the TE device. When voltage is applied in one direction, one side (e.g., the first side) creates heat while the other side (e.g., the second side) absorbs heat. Switching polarity of the circuit creates the opposite effect. In a typical arrangement, a TE device comprises a closed circuit that includes dissimilar materials. As a DC voltage is applied to the closed circuit, a temperature difference is produced at the junction of the dissimilar materials. Depending on the direction of the electric current, heat is either emitted or absorbed at a particular junction. In some embodiments, the TE device includes several solid state P- and N-type semi-conductor elements connected in series. In certain embodiments, the junctions are sandwiched between two electrical isolation members (e.g., ceramic plates), which can form the cold side and the hot side of the TE device. The cold side can be thermally coupled to an object (e.g., electrical conductor, electrical device under thermal management, etc.) to be cooled and the hot side can be thermally coupled to a heat sink which dissipates heat to the environment. In some embodiments, the hot side can be coupled to an object (e.g., electrical conductor, electrical device under thermal management, etc.) to be heated. Certain non-limiting embodiments are described below.

Figure 1B:
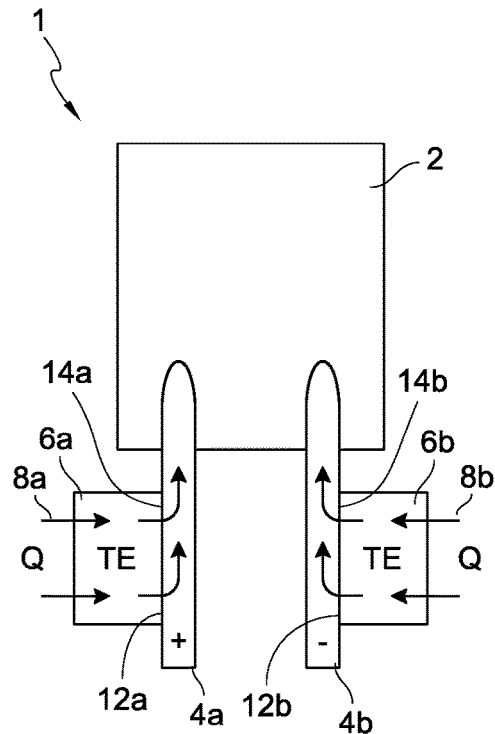

FIGS. 1A-1B illustrate schematics of example thermal management systems 1. In some embodiments, a thermal management system 1 can include at least one TE device 6a, 6b in substantial thermal communication with a heat exchange surface of at least one electrical conductor 4a, 4b (e.g., a current carrying connector, an electrode, portion of a cell, terminal wires, wiring between electrodes or portions of cells, leads, etc.) of an electrical component or device 2 (e.g., power amplifiers, transistors, transformers, power inverters, insulated-gate bipolar transistors (IGBT's), electric motors, high power lasers and light-emitting diodes, batteries, etc.). The term "substantial thermal communication" is used herein in its broad and ordinary sense and includes, for example, snug contact between surfaces at the thermal communication interface; one or more heat transfer materials or devices between surfaces in thermal communication; a connection between solid surfaces using a thermally conductive material system, wherein such a system can include pads, thermal grease, paste, one or more working fluids, or other structures with high thermal conductivity between the surfaces; other suitable structures; or a combination of structures. Substantial thermal communication can take place between surfaces that are directly connected or indirectly connected via one or more interface materials.

In some embodiments, at least one TE device can be connected to an electrical device under thermal management. In some embodiments, at least one TE device can be in substantial thermal communication with (e.g., contact, attached to, etc.) an electrical component, part, portion or device under thermal management. In such instances, the electrical conductors can conduct both electrical energy and thermal energy between temperature-sensitive regions of the electrical device and one or more external devices. When operated in a cooling mode, the heat Q is pumped from the electrical conductors 4a, 4b (and from the electrical device 2) as shown by arrows 8a, 8b in FIG. 1A and dissipated into the outside environment, which can be air, liquid, another solid component, or a combination of components. When operated in the heating mode, the thermal power will be pumped in the reverse direction, delivering the heat into the electrical device 2 through the electrical conductors 4a, 4b as shown by arrows 8a, 8b in FIG. 1B.

Figure 2:
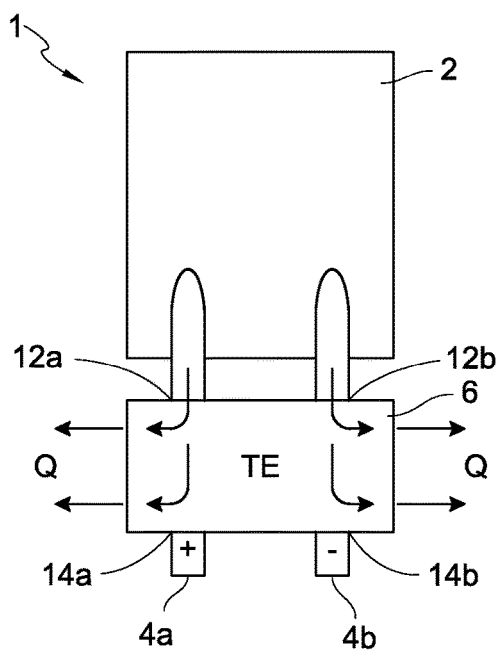
FIG. 2 schematically illustrates an example thermal management system with a TE device in thermal communication with two electrical conductors of an electrical device.
Figure 3:
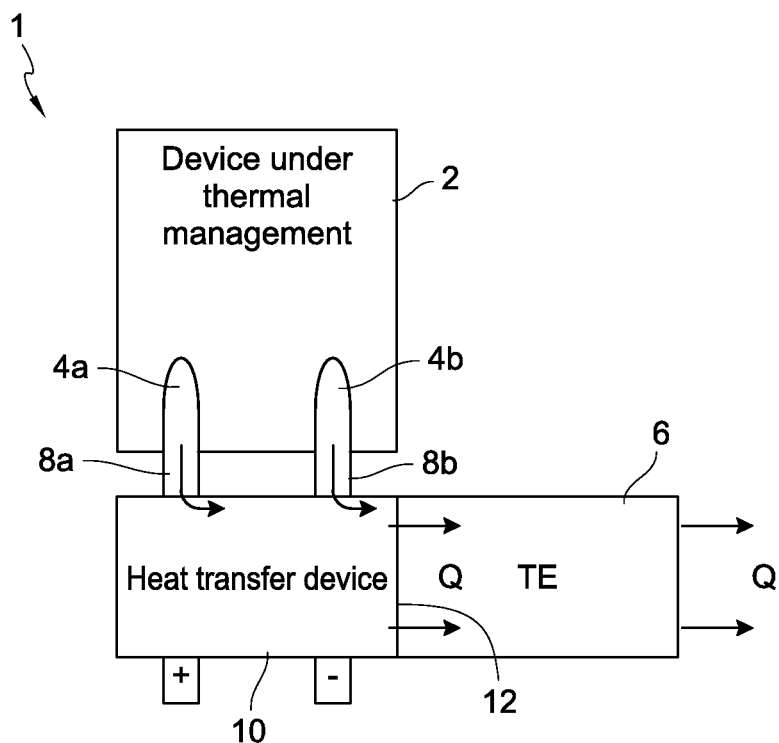
FIG. 3 schematically illustrates an example thermal management system with a TE device in thermal communication with electrodes of a battery via a heat transfer device.

FIGS. 1A-1B show separate TE devices 6a, 6b that inject or remove heat Q from separate electrical conductors 4a, 4b, respectively. In some embodiments, a single TE device 6 can be used to control (e.g., be in substantial thermal communication with) two or more electrical conductors 4a, 4b as illustrated in FIG. 2. In some embodiments, one or more electrical conductors can be in substantial thermal communication with no TE devices. In some embodiments, the TE devices are in substantial thermal communication with the electrical conductors. In some embodiments, this substantial thermal communication can be accomplished by a direct attachment of the TE device to the electrical conductor, or by using an efficient thermal or heat transfer device 10 or thermally conductive apparatus (e.g., a surface of a heat exchanger, a heat pipe, shunt or heat plane) positioned between the electrical device 2 under thermal management and surface 12 of the TE device 6, as illustrated in FIG. 3. In some embodiments, the thermal transfer device 10 can be attached to, directly or indirectly contact at least one electrical conductor 4a, 4b and/or at least one TE device 6.

As shown in FIGS. 1A, 1B, and 2, in some embodiments, a thermal management system 1 can include at least one TE device 6, 6a, 6b. A surface 12a, 12b of the TE device 6, 6a, 6b can be in direct or indirect contact with a solid surface 14a, 14b of at least one electrical conductor 4a, 4b. The electrical conductor 4a, 4b can be configured to deliver electric power to an electrical device 2 such that the electrical conductor 4a, 4b also serves as a conduit for conducting thermal energy between temperature-sensitive regions (e.g., heat Q) in the electrical device 2 and the TE device 6, 6a, 6b. In some embodiments, the interface between the surface 12a, 12b of TE device 6, 6a, 6b and solid surface 14a, 14b can include a thermally conductive material system (not shown) configured to facilitate substantial thermal communication between the surfaces. For example, the thermally conductive material system can include grease, paste, pads, material with high thermal conductivity, material with thermal conductivity greater than or equal to about 100 W/(m×K), another suitable material, or a combination of materials. In some embodiments, a thermally conductive material system can be positioned at an interface between one or more surfaces of a thermal transfer device and surfaces of a TE device and/or electrical conductor.

In some embodiments, a fluid connection can be configured between, around and/or through the TE device 6, 6a, 6b and at least one electrical conductor 4a, 4b that is used to facilitate the transfer of electric power to or out of the electrical device 2. In some embodiments, a working fluid can be used to facilitate the transfer of thermal energy between an electrical device 2 and a TE device 6, 6a, 6b.

A controller can be provided to control the TE device to perform either a heating or cooling function and/or adjust the electric power delivered to the TE device. The TE device can be powered inline with the device under thermal management or via an external power supply or source. In some embodiments, TE devices are electrically powered and controlled to perform their heat pumping function to and/or from a device under thermal management. The power and control function can be performed by a separate electronic control unit, ECU 40. The ECU 40 can adjust the electric power delivered to the TE device 44 associated with the TE management of the device 46. In some embodiments, the ECU 40 takes inputs from one or more temperature sensors 42 that sense the thermal condition of the device 46 directly or via electrical conductors (not shown), compares them to algorithms and issues a controlling signal for the TE device 44 to perform either a heating or cooling function, as illustrated in the FIG. 4. In some embodiments, the ECU 40 can be configured to take inputs other than temperature (e.g., the current pushed in and/or out to the TE device 44 and/or device 46, etc.) from other sensors (not shown) and adjust the cooling and/or heating output to/from the device 46. The controller may be integrated with the rest of the electronics supporting the device under thermal management. For example, if such device is a battery pack, then it is typically outfitted with a Battery Management System, or BMS, which is configured to monitor the health of the battery and/or administer control functions in response to internal and/or external changes. The TE controller functionality can be integrated into the BMS and can be co-located on the same printed circuit board or using the same chipsets that perform BMS functions.

Figure 6:
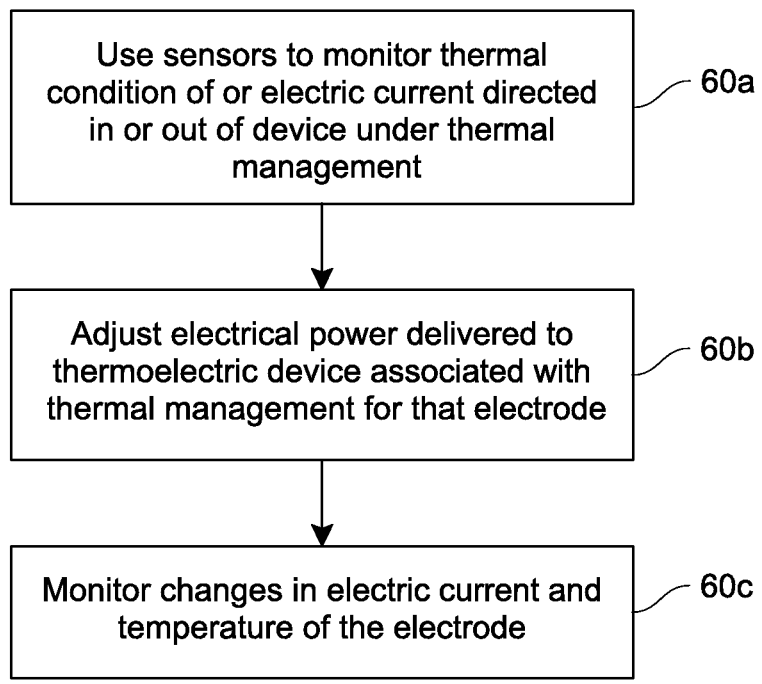
FIG. 6 illustrates an example method for controlling heating and/or cooling provided to an electrical device by a thermal management system.

The steps an example thermal management system can undergo in some embodiments to actively thermally manage an electrical device are illustrated in FIG. 6. In the first step 60a, sensors can be configured to monitor the thermal condition and electric current directed in or out of the device under thermal management. The second step 60b, includes adjusting the electric power delivered to the TE device associated with the thermal management of the device. In a third step 60c, changes in electric current and temperature of the electrical conductor are monitored. Steps 60a-60c can be repeated.

In some embodiments, to facilitate such temperature control, it can be helpful to determine the ambient temperature, the temperature of at least one of the sides of a TE device and/or a temperature within the TE device. Thus, some embodiments of a TE system can include one or more, a combination, or none of the following: an ambient temperature sensor, a TE device temperature sensor (such as a thermistor) located inside, adjacent to, near, or otherwise in close proximity to the TE device and/or the like.

However, some embodiments including one or more TE device temperature sensors can be less desirable due to, for example, the cost of the sensor, the additional manufacturing steps and complexity associated with positioning the sensor in the system, the possibility of sensor failure, thermal lag and/or one or more other reasons or considerations. In some embodiments, a thermal management system can include a power source operably coupled with a TE device having first and second sides and does not include a temperature sensor to determine the temperature of one of the sides of the TE device and/or the device under thermal management. Rather, the thermal management system is configured to determine the temperature of one of the first and second sides (or a temperature differential across the TE device) by the potential induced by the Seebeck effect.

In certain embodiments, the power source can be turned off (e.g., supply zero volts to the TE device). In such instances, a temperature difference between the first and second sides can induce a potential between the first and second sides. The inducement of this potential is known as the Seebeck effect. The potential produced is generally proportional to the temperature difference between the first and second sides and can be expressed by the following equation:

$$V = \alpha(T_h - T_c) = \alpha \Delta T$$

Where V is the potential between the first and second sides, $\alpha$ is the Seebeck coefficient, and $(T_h - T_c)$ or $\Delta T$ is the temperature difference between the first and second sides. As such, the Seebeck coefficient for a given TE device can be described as the ratio of the potential to the temperature difference between the first and second sides.

In some cases, the Seebeck coefficient $\alpha$ can be determined experimentally. In certain configurations, for a TE system with a known Seebeck coefficient $\alpha$, the temperature difference between the first and second sides can be determined based on the voltage potential. Such a configuration can, for example, provide for monitoring of the temperature difference of the TE device without the need for a separate temperature sensor. As noted above, the elimination of such a temperature sensor can facilitate manufacturing (e.g., reduce process steps), decrease manufacturing time, reduce costs, increase device longevity, and/or provide one or more other advantages or benefits. Further, not including of such a sensor can simplify the design of the TE device, for example, by eliminating channels through the TE device for the passage of wires for the sensor. Furthermore, not including such a sensor can improve reliability of the system by reducing the total number of components that could fail.

In some embodiments, the thermal management system is configured to determine an absolute temperature of at least one of the sides of the TE device. In some embodiments, an ECU is in communication with an ambient temperature sensor and is configured to determine the potential. For example, an analog input of the ECU can be in communication with a negative temperature coefficient device or other device, from which a signal can be used to determine (e.g., by a calculation) an ambient temperature. Such a configuration can, for example, allow for the determination of an absolute temperature of at least one of the first and second sides of the TE device. For example, the absolute temperature can be determined with a calculation or by correlating the potential with a known (e.g., by empirical measurements) absolute temperature for at least one of the first and second sides.

In some embodiments, the temperature difference and/or the absolute temperature of at least one of the sides is used in a feedback control scheme, which can, for example, provide for a faster response time and/or reduced thermal lag for temperature feedback compared to systems employing a separate temperature sensor.

In some embodiments, the temperature difference and/or the absolute temperature of at least one of the sides is used for fault monitoring. For example, the temperature difference and/or the absolute temperature of at least one of the sides can be used to detect overheating of the TE device, which could reduce the efficiency of the TE device or otherwise damage the device and/or other components of the thermal management system.

In some embodiments, each of the TE devices can be powered by a power source, which can selectively provide electric power to each of the devices. In certain embodiments, the TE devices share a common power source. In other arrangements, the TE devices each has a dedicated power source.

Figure 4:
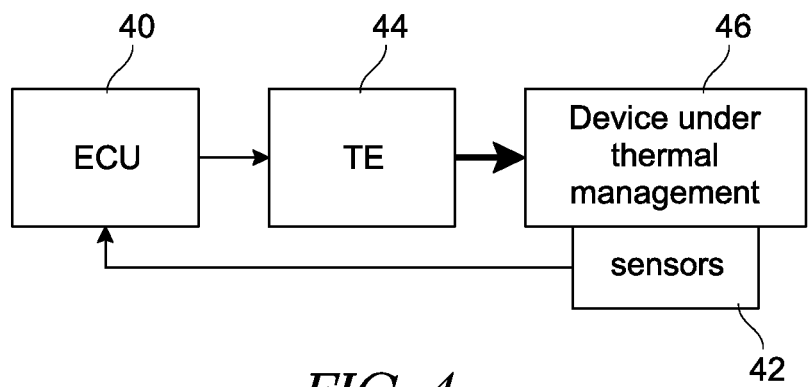
FIG. 4 schematically illustrates an example thermal management system with an electronic control unit (ECU) configured to control heating and/or cooling provided to an electrical device.
Figure 5:
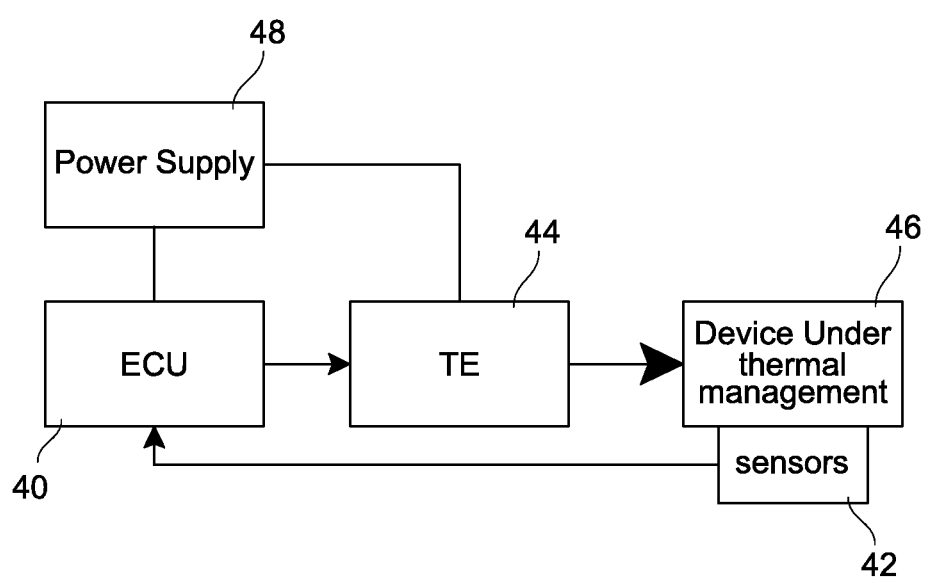
FIG. 5 schematically illustrates an example thermal management system with an external power supply.

In some embodiments as illustrated in FIG. 4, the electric power to a TE device 44 is decoupled from the electric power flowing to/from the device 46 under thermal management. As shown in FIG. 5, in some embodiments, an external power supply 48 not under TE management (e.g., an external battery, etc.) can be configured to supply power to the ECU 40 and/or the TE device 44. However, in some embodiments, a TE device 76 can be powered in-line with the electrical conductors 74a, 74b of a device 76 under thermal management. In some embodiments, a fraction (≤100%) of the electric current that flows through the device 72 under thermal management can also flow directly through the TE device 76 as illustrated in some embodiments in FIGS. 7A-7B. In some embodiments, the TE device 76 can be in an electrical parallel or series connection with the device 42 relative to the rest of the circuit, as illustrated in FIGS. 7A and 7B respectively.

Figure 7A:
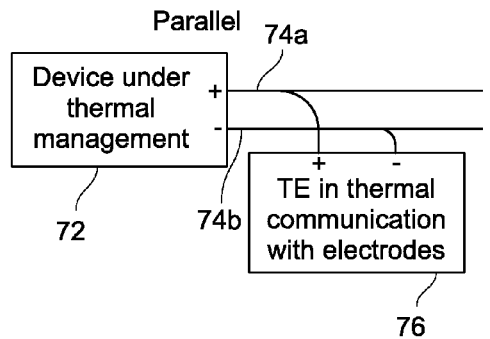
FIG. 7A schematically illustrates an example electrical configuration of a thermal management system.
Figure 7B:
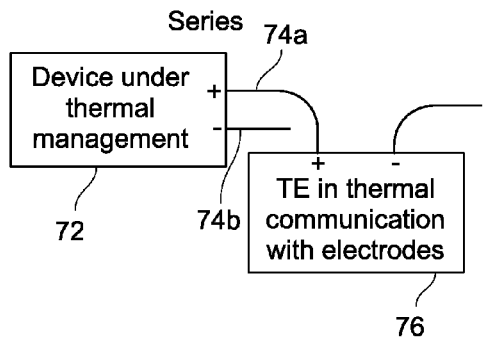
FIG. 7B schematically illustrates another example electrical configuration of a thermal management system.

In some embodiments, for example a parallel connection as illustrated in FIG. 7A, only a fraction of the current is flowing through the TE device 76 (the value depends on the ratio of the resistances of TE device and the load). In some embodiments, for example a series connection as illustrated in FIG. 7A, all current flows through TE device 76.

In some embodiments, the benefit of such an in-line arrangement of TE power is the simplification (and cost reduction) of control circuitry. A TE device 76 is powered and pumping heat away from (or to) the device 72 whenever the electric power is flowing through the device 72. Therefore, by sizing the heat pumping capacity of the TE device 76 appropriately and relative to the range of possible operating conditions, it is possible to use such a "built-in" control of thermal condition of the device 72 under management. No separate thermal sensing of the battery condition is needed.

The inline connection and control scheme can be used when one mode of TE operation is desired (e.g., cooling). In such arrangements, electric current flows in one direction. The inline connection and control scheme can also be used when the mode of operation (e.g., heating or cooling) is consistent with the direction of current flow. This is largely the case with power electronics or devices, but could be different in the case of batteries. In batteries, often both heating and cooling are needed depending on the ambient conditions, and also the direction of current flow depends on whether the battering is operating in a charging mode or a discharging mode.

In some embodiments, one or more diodes or other electric current control devices can be positioned along the conductor between an electrode and a TE device. Such current control devices can be configured to prevent an undesired operating mode from occurring during charging or discharging of the device under thermal management. In certain such embodiments, the thermal management system can be configured to perform only a cooling mode of operation or only a heating mode of operation, regardless of the direction of current flow (e.g., charging or discharging) to the electrical device. Such embodiments can be beneficial, for example, when environmental conductions, properties of the device, or other factors make only one mode of operation desired.

A TE device can be positioned closer to or further from the device under thermal management depending on the application. In some embodiments, from the thermal management point of view, it is beneficial to locate the heat pump (e.g., TE device) as close to the device that is being thermally managed as possible. Such localization results in the most efficient use of thermal management, avoiding unnecessary thermal and electric losses. For example, in case of power electronics it is desirable to locate a heat management system as close to the heat source (e.g., semiconductor junction) as possible.

Figure 8A:
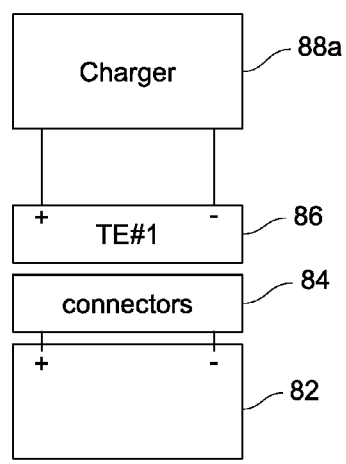
FIG. 8A schematically illustrates an example thermal management system connected to an electrical device receiving electric power.
Figure 8B:
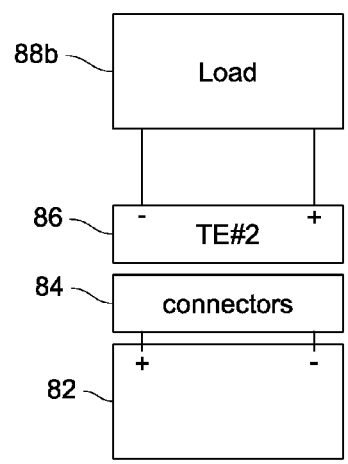
FIG. 8B schematically illustrates an example thermal management system connected to an electrical device providing electric power to a load.

However, in some cases, the TE device can be located further away from the device for the benefit of improved system logistics. In such cases, the TE device is still capable of cooling the power leads. An example of such trade-off is a battery 82 operating either in charging or discharging conditions and a TE device connected in an in-line fashion as described above. The direction of current is opposite between the two modes of battery operation. In this application, one or more TE devices 86 can be incorporated in the charger side 88a of the battery charger and in the load side 88b of the battery connector 84. Such connection schemes are illustrated in FIGS. 8A-8B. The difference between the two connections illustrated in FIGS. 8A-8B is the polarity of the TE device 86. By switching the polarity between the two modes it can be always ensured that the battery 82 is being cooled in both charging and discharging modes, independently of the current flow direction.

A similar polarity switch function can be achieved by using a single TE device 86 and a relay or switch (not shown) that changes the polarity of the electric current flow through the TE device in response to change of the direction of current flow in a battery 82. However, in some applications, persistent cooling of the battery 82 is desired, e.g., in rapid charging. In some embodiments, the TE devices can be built into the connectors 84 on the cable side of the battery charger. The polarity of TE devices in this case should be appropriate to cool the leads during charging.

A TE device or module can be constructed into various geometries, shapes and sizes. A typical TE device is a flat or planar module with two parallel surfaces. One of the most common sizes of such modules is 40×40 mm with thickness ranging below a millimeter to multiple millimeters. The heat is removed from one surface and moved to the other. A change in device polarity changes the direction of heat flow. A myriad of other device sizes is available on the commercial market. Typically, the size of the device is application-specific and matched to electrical and thermal impedances of the system.

Such flat modules can be either directly applied to electrodes that need to be cooled, provided that the electrodes have appropriately sized flat sections. FIG. 9 illustrates an example thermal management system configuration 90 with a flat TE module 92 in substantial thermal communication with an electrical conductor, e.g., an electrode 94 having a flat surface 96.

Alternatively, at least one intermediate heat spreader 98a or heat concentrator 98b made of materials with high thermal conductivity (e.g., copper, aluminum, etc.) may be positioned between TE device 92 and the electrode 94 to match the geometrical size differences, as illustrated in FIGS. 10A-10B.

Figure 11:
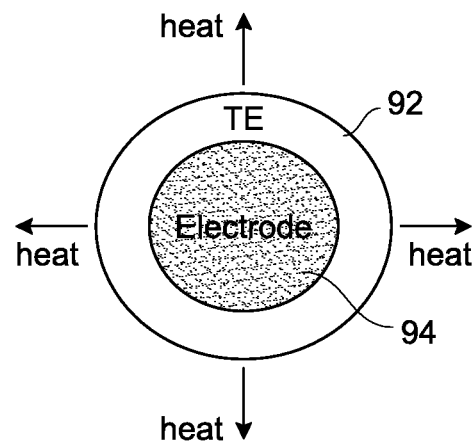
FIG. 11 is a cross-sectional view of thermal management system with a curved TE device.

In some embodiments, another option for mating TE devices and electrodes or other electrical conductors is to change the shape of a TE device 92 from flat to cylindrical, essentially concentric with or surrounding the electrode 94, as illustrated in FIG. 11. In this case, the heat would be moved away from (or to) the electrode radially which is potentially a more optimal thermal management path. Other non-planar shapes not limited to cylindrical can also be used.

Figure 12:
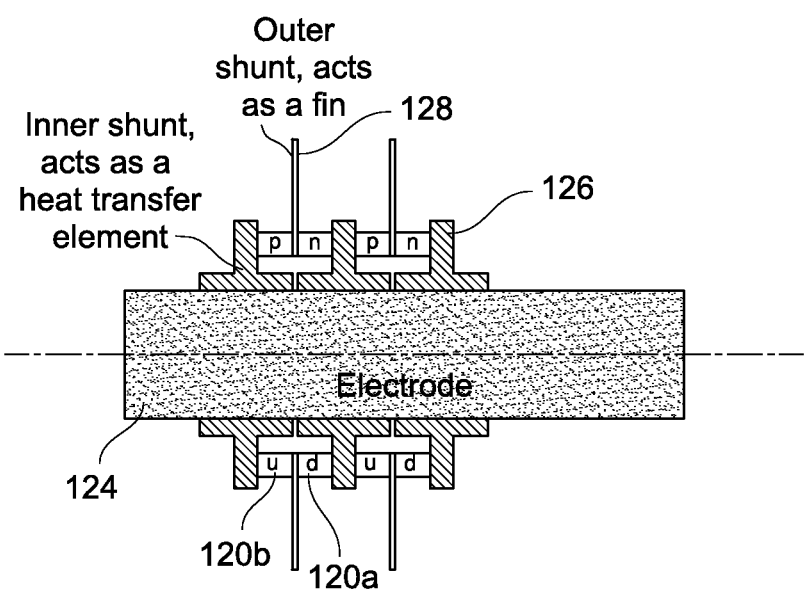
FIG. 12 is another cross-sectional view of a thermal management system with a curved TE device.

Such a cylindrical TE device may be implemented in a variety of ways. One solution is to implement a high power density T-shunt architecture as described in U.S. Pat. No. 6,959,555, which is incorporated by reference in its entirety. In some embodiments, individual p- and n-type thermoelectric elements 120a, 120b can be located in a ring pattern around the electrode 124, as illustrated in FIG. 12. Alternatively, p and n semiconductors can be made as a full ring as opposed to smaller pellets. The inner, smaller diameter shunts 126 can act as heat exchangers communicating with the cooled electrodes 124. The outer, larger diameter shunts 128 can act as fins discharging waste heat into the air surrounding the cooled electrode.

An insulator can be used to thermally insulate an electrical device under thermal management and help prevent heat from passing through to the rest of a circuit via external leads. In some embodiments, the thermal management of electrical devices can suffer from a problem of parasitic losses because if the electrical conductors (e.g., terminals) are cooled, then some of the cooling does not go towards the device under thermal management but rather leaks through the wires or leads towards the rest of the circuit. In other words, the external leads act as thermal conductors that act as a thermal load parallel to the device under thermal management in relation to the TE device.

Figure 13:
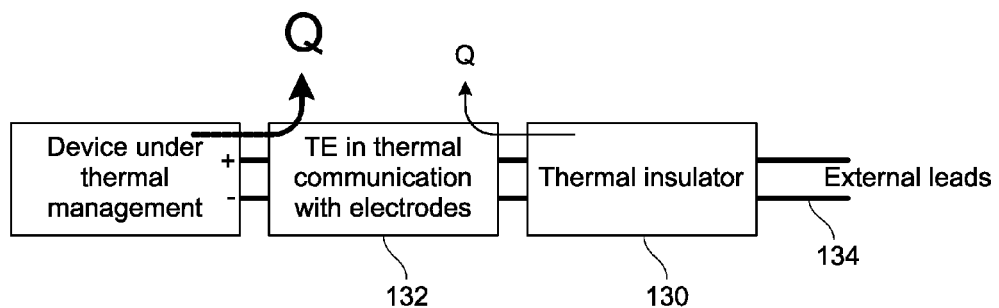
FIG. 13 schematically illustrates an example thermal management system with a thermal insulator connected electrically in-line with external leads.

In order to minimize the parasitic effect of such leaks, a thermal insulator 130 positioned between TE device 132 and the rest of the circuit can be introduced as illustrated in FIG. 13. Such a thermal insulator 130 (or multitude of insulators, e.g., one or more per lead) can be connected electrically in-line with the external leads 134. In some embodiments, electric current can flowing freely, or with minimal penalty, through such an insulator 130. Thermally, however, the insulator has very low thermal conductivity, so that the heat does not pass through it efficiently. "Q" is the amount of heat flowing to/from the device under thermal management and/or external leads. Large Q signifies large flow of heat and/or cooling power.

There are a number of possible physical implementations of a thermal insulator. In some embodiments, a thermally insulating material has high electrical conductivity and low thermal conductivity. One good type of material satisfying these requirements is thermoelectric material. For example, thermoelectric materials can be used as thermal insulators in an application of electrical feed through for superconductive magnets, such as described by Yu. Ivanov et al., Proceedings of International Conference on Thermoelectrics, Shanghai, 2010. However, the insulator does not have to be made of TE material, as in this application the Seebeck performance of the insulator material is not necessarily important. Other examples could be electrically conductive ceramics, conductive foams or other materials.

Cooling and heating of multiple electrical devices or components in electrical communication with each other can be provided by a thermal management system. A number of discrete electronic components that may require thermal management can be connected in series or in parallel electrically. For example, a battery pack can be built by connecting a plurality of individual cells in series electrical communication. The example described below uses a battery pack as an example of a system under thermal management. The features described, however, are not limited to thermal management of batteries only and are applicable to thermal management of other electronic components or electrical devices.

Figure 14:
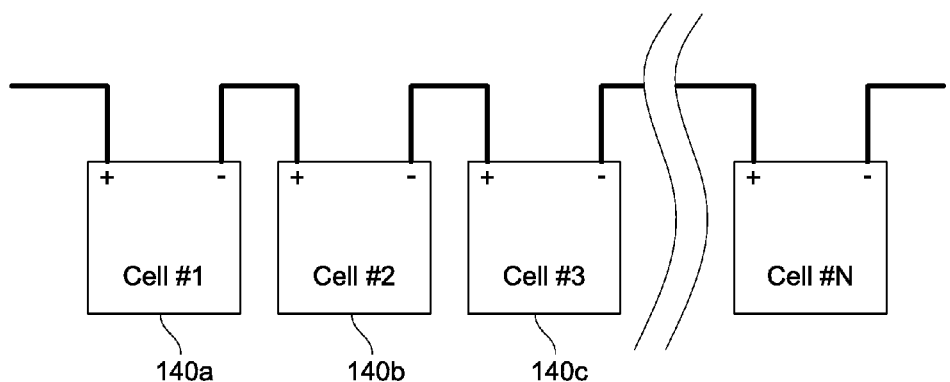
FIG. 14 schematically illustrates an example battery pack including cells electrically connected in series.
Figure 15:
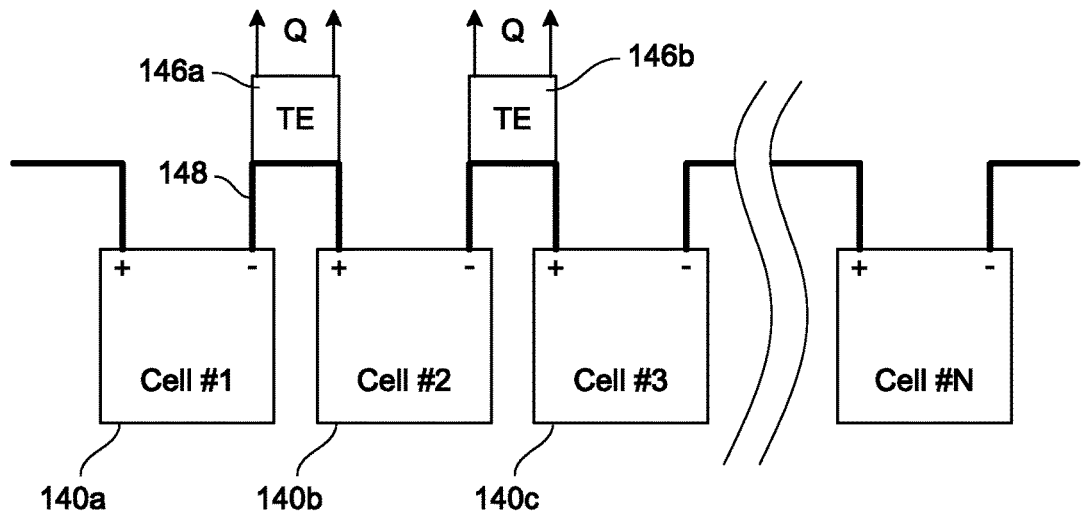
FIG. 15 schematically illustrates an example thermal management system that connects adjacent cells of the battery pack of FIG. 14.

In some embodiments, a thermal management system can include a battery pack including N cells 140a-140c connected in series as depicted in FIG. 14. The individual cells can have different shapes and internal construction, such as cylindrical, prismatic, pouch or other cell packaging types. Thermal management of individual cells 140a-140c by at least one TE device 146a, 146b can be especially effective when applied to electrical leads or internal wires 148 that connect adjacent cells, as opposed to thermal management through the terminal wires that bring electric current in and out of the battery pack. FIG. 15 illustrates one embodiment of TE devices 146a, 146b directly connected to or contacting such internal wires 148 that connect the individual cells 140a-140c.

Figure 18:
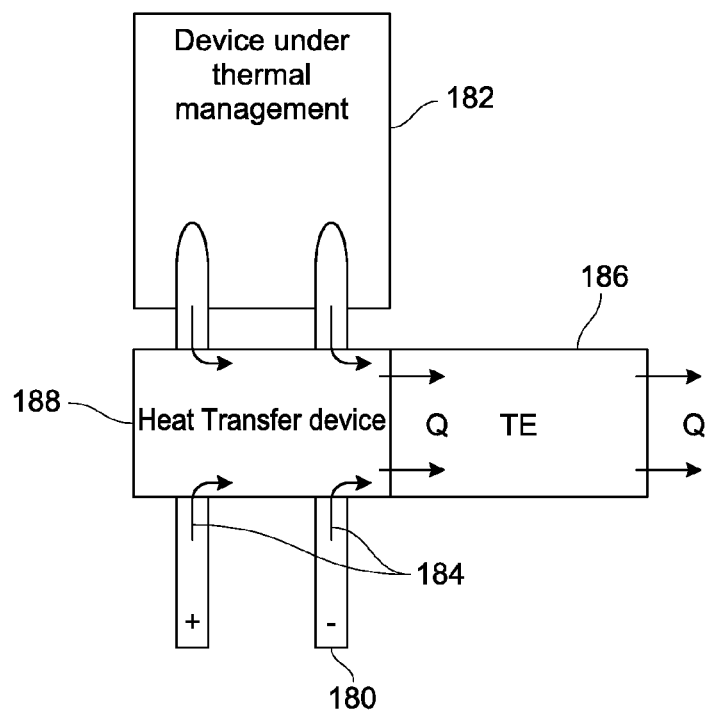
FIG. 18 schematically illustrates an example thermal management system.

In this configuration in some embodiments, when TE devices 146a, 146b are thermally connected to internal wires 148 that connect adjacent cells 140a-140c, substantially all of the thermal energy is delivered inside and/or extracted from the cells. This is distinctly different from an arrangement when a TE device 186 is thermally connected to a terminal or external wire 180 that connects the battery 182 with other elements. In the latter case, a part of the thermal energy 184 can escape through the wire 180 away from the battery 182, and the overall system level thermal management efficiency can be diminished. Such adverse effect is depicted in FIG. 18.

In some embodiments, a thermal management system is configured to thermally manage only the connections that are internal to the battery pack or other electrical device. For example, battery pack embodiments disclosed herein having cells connected in series can have this configuration. This thermal management approach can be applied to any arrangement of individual elements in the pack provided that only internal wires are thermally managed. The thermal management can be applied substantially only to electrical connections that originate and terminate inside the pack, and not to the connections that connect the pack to the rest of the system.

The individual elements can be connected in series, in parallel, or even belong to independent electric circuits. Additionally, in some embodiments, a single TE device can be in substantial thermal communication with a single cable connecting adjacent cells, or a plurality of such cables, therefore spreading the thermal management across several cells.

In some embodiments, all electrical conductors can be connected to at least one TE device. In some embodiments, at least one electrical conductor or component is not connected to a TE device. For example, as illustrated in FIG. 15, cell 140a only has one internal wire 148 connected to a TE device 146a. The other internal wire is not connected to a TE device. In some embodiments, all the internal wires of a cell or electrical component are not connected or in thermal communication with a TE device. In some embodiments, one or more entire cells, internal wires, or electrical conductors are not connected to any TE device. For example, in some embodiments, cells closer to the center of the battery are connected to at least one TE device while outer cells of the battery are not connected to at least one TE device. Individual electrical conductors can have independent thermal couplings with TE devices.

In some embodiments, a thermal management system can control or thermally manage individual cells or groups of cells. Such embodiments can permit a thermal management controller to control the temperature of electrical conductors or components independently from other conductors or components of the electrical device. In certain such embodiments, thermal control can be localized to the cell level. In some such embodiments, the thermal management system is configured to minimize or reduce cell to cell variation, avoid or reduce cell degradation, and/or allow for independent thermal management tuning.

Figure 16:
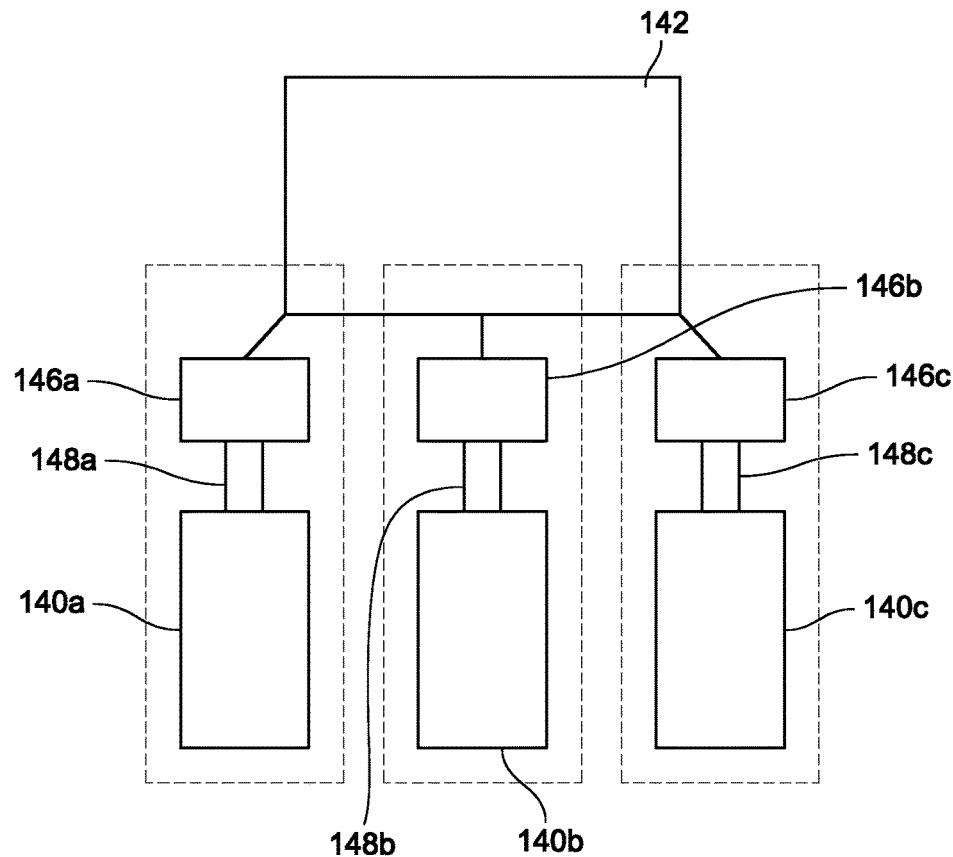
FIG. 16 schematically illustrates another example thermal management system.

As illustrated in FIG. 16, in some embodiments, a thermal management system can include a controller 142. The controller can be connected with TE devices 146a-146c. In some embodiments, each of TE devices 146a-146c can be connected to at least one electrical conductor 148a-148c of cells 140a-140c. Each of the cells 140a-140c can be thermally controlled by the system independently of one another. The electric power directed to or out of each TE device 146a-146c that provides heating and/or cooling to the cells 140a-140c can be varied, changed, or adjusted for each TE device and/or cell independently of another TE device and/or cell.

Figure 17:
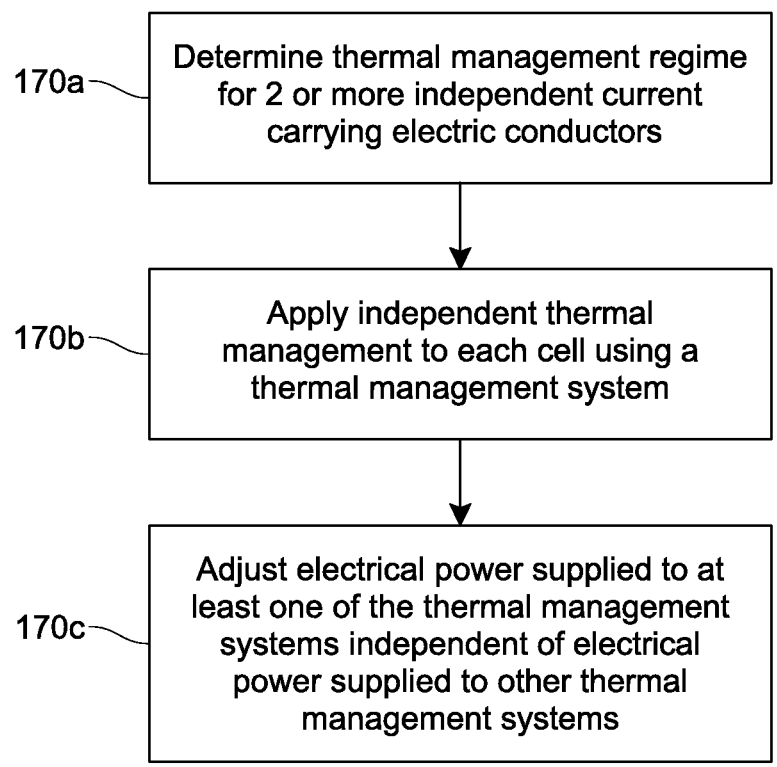
FIG. 17 schematically illustrates an example method for heating and/or cooling an electrical device.

FIG. 17 illustrates an example method for independently controlling the temperature of multiple temperature-sensitive regions (e.g., battery cells) of an electrical device. The method can include determining the thermal management regime for 2 or more independent current carrying electrical conductors (170a). Independent thermal management can be applied to each cell using a thermal management system (170b). Electric power supplied to at least one of thermal management systems can be adjusted independent of electric power supplied to the other thermal management systems (170c).

In some embodiments, a heat pipe can be provided as a waste heat transport mechanism. Waste heat from a TE device can be dissipated in a heat sink. Examples of heat sinks include heat exchangers, waste streams, other structures for dissipating heat, and combinations of structures. A heat sink can be attached to the waste side or surface of the TE device. The heat sink can be cooled by air, liquid, or, alternatively, it can be a solid member connecting the TE device with a bigger solid heat sink such as a battery case, car frame, or another structural element that dissipates heat effectively. However, in practical applications, such as, for example, a battery thermal management system, there can be packaging constraints that limit the possibility of bringing the cooling media close to the waste side of the TE device. Alternatively, a heat or thermal transport device may be used to move the heat from the waste side of the TE device to another location where heat dissipation may be implemented effectively.

Figure 19:
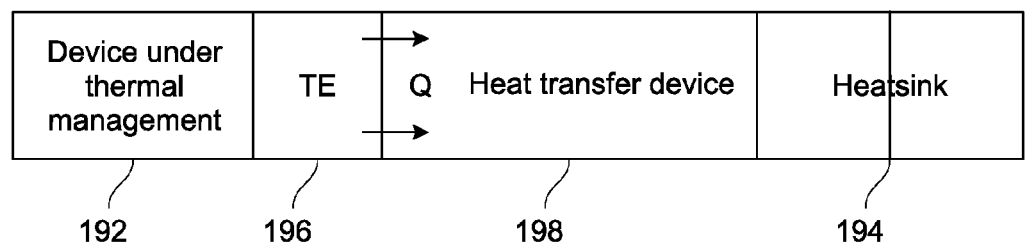
FIG. 19 schematically illustrates an example thermal management system with a heat sink.

In some embodiments, a heat transfer device 198 can be used to connect the waste side or surface of the TE device 196 to a heat sink 194 where the heat is ultimately dumped by, for example, air, liquid, or solid, as illustrated in FIG. 19. Such a heat sink can be for example the liquid cooling circuit of the car, a radiator or an air cooled heat sink, ambient air, working fluid, fluid reservoir, or a solid body (e.g., battery case or car frame).

FIGS. 20-28 illustrate other embodiments of thermal management system configurations for cooling and/or heating electrical, electronic, and power devices and/or components such as, for example, a battery or battery pack. These embodiments can be combined with or comprise one or more of any of the features and embodiments described above. As discussed above, a battery pack can include one or more cells connected in series and/or parallel. The thermal management system can be used to cool and/or heat the electrical conductors of the battery directly or indirectly.

Figure 20:
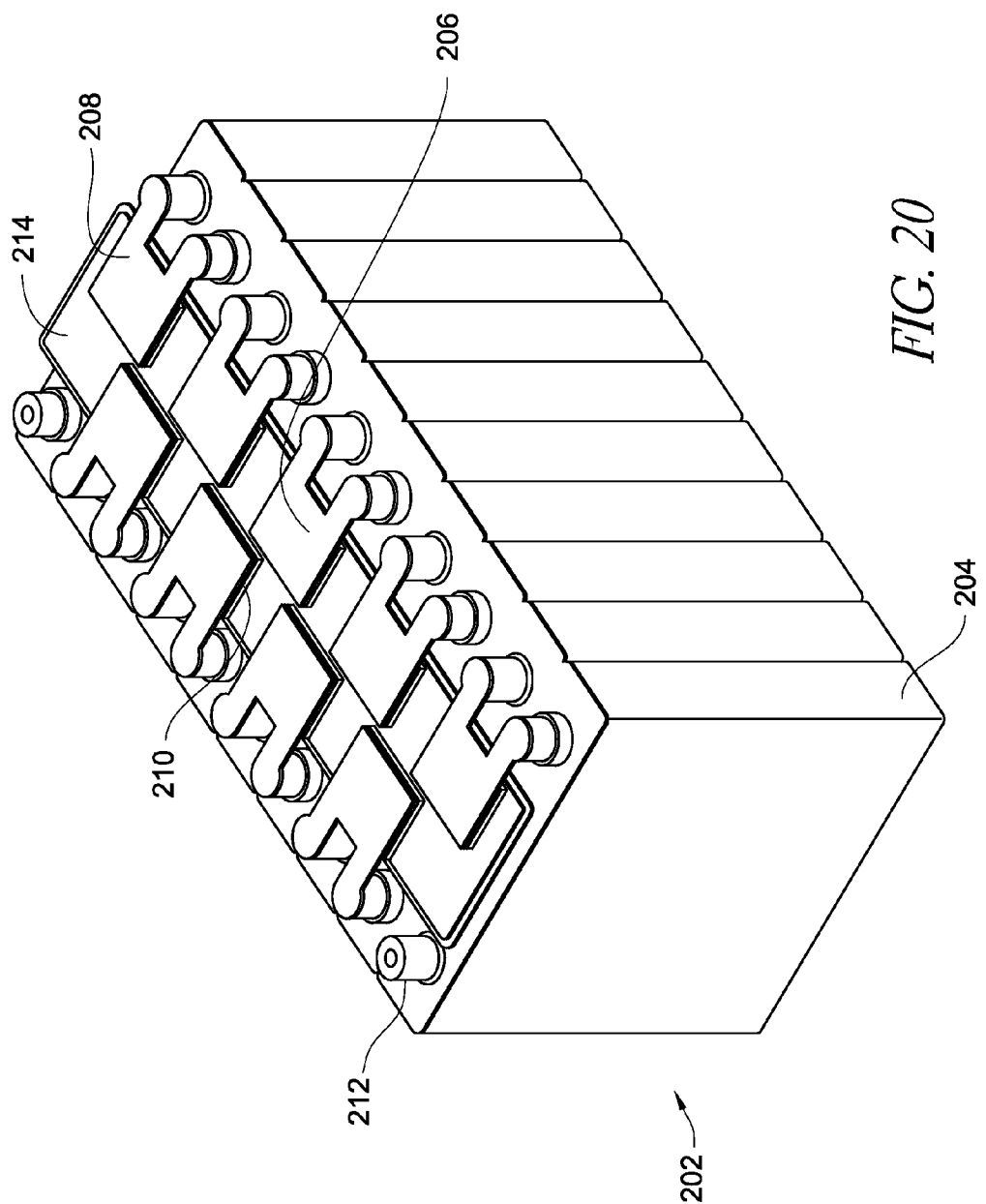
FIG. 20 is a perspective view of an example thermal management system.
Figure 21:
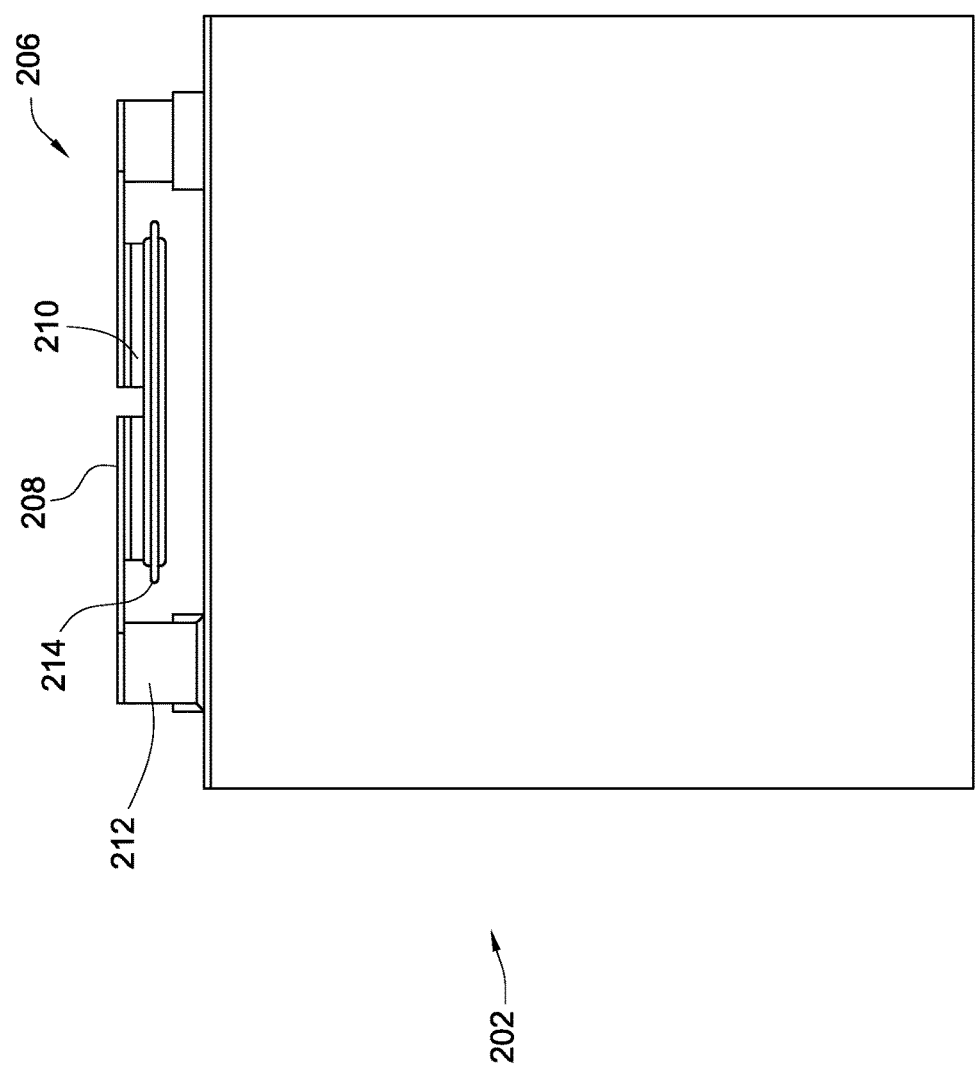
FIG. 21 is an end view of the thermal management system of FIG. 20.

FIGS. 20-21 illustrate an embodiment of a thermal management system including a battery pack 200 having multiple cells 204 electrically connected with one another to provide a single functional battery pack 200. In some embodiments, individual cells of the battery 202 can be electrically connected together in series via electrically conductive bars or other connectors. In some embodiments, the thermal management system can include one or more thermoelectric devices 206 integrated with or connected to (e.g., in substantial thermal communication with) one or more terminals 212 of one or more cells 204 of the battery 202. As illustrated in FIG. 20, in one embodiment, the cells 204 connected in series can have two parallel rows of terminals 212 that extend along a top surface of the battery 202. In some embodiments, the terminals 212 include positive and negative terminals (e.g., anodes and cathodes). In certain such embodiments, the positive and negative terminals are spatially positioned in an alternating arrangement. The thermoelectric device 206 can have a copper substrate 208 layered on a ceramic substrate 210 or any other suitable configuration. In some embodiments, one end or portion of each thermoelectric device 206 can be connected to or integrated with at least one terminal 212 of two adjacent cells 204 that are connected in series. In some embodiments, at least one terminal 212 is not in substantial thermal communication with or connected to at least one TE device 206. Another end or portion of each thermoelectric device 206 can be connected, clipped, adhered, bonded, clamped, or otherwise attached to a heat transfer device 214. The heat transfer device 214 can be, for example, a liquid tube heat exchanger. In some embodiments, one heat transfer device 214 can be attached to each thermoelectric device 206 or to all of the TE devices. In other embodiments, multiple heat transfer devices 214 can be attached or in substantial thermal communication with each thermoelectric device 206.

As illustrated in FIGS. 20-21, in some embodiments, the heat transfer device 214 can extend along at least a portion of the top surface of the battery 202 between the two parallel rows of terminals 212. In certain embodiments, the terminals are not in parallel rows. FIG. 21 illustrates that in some embodiments, the heat transfer device 214 can be positioned such that it does not directly contact or touch a surface of the battery 202. In certain embodiments, the heat transfer device 214 can be in direct contact with the battery or surfaces of the battery 202. In some embodiments, the ceramic substrate 210 interfaces with the heat transfer device 214 and provides support or robustness. The copper substrate 208 can carry the current draw of the battery 202. In some embodiments, the heat transfer device 214 can include both electrically conductive portions and electrically insulating portions. In some embodiments, the electrically conductive portions can extend toward each other.

Figure 22:
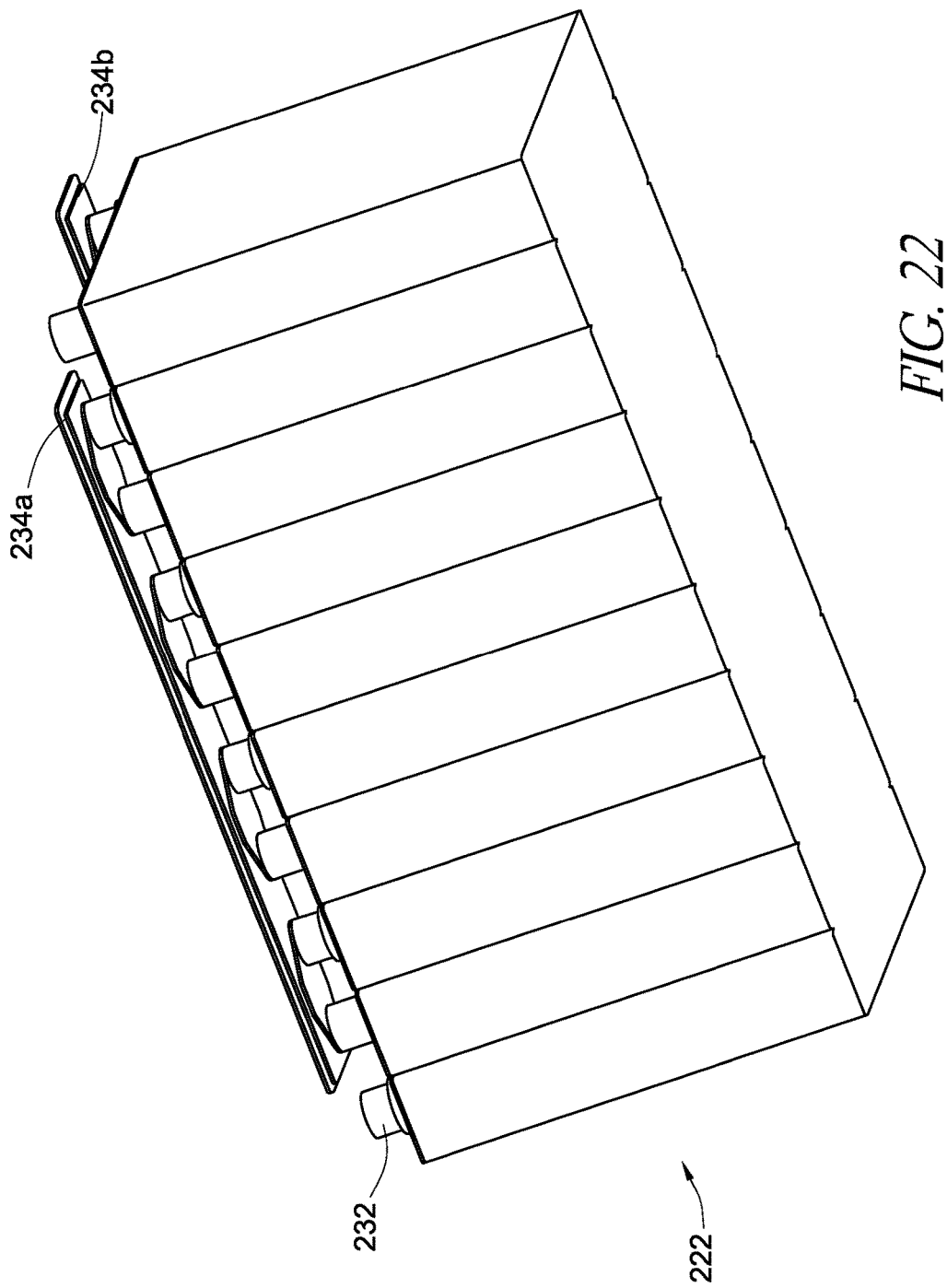
FIG. 22 is a perspective view of another example thermal management system.
Figure 23:
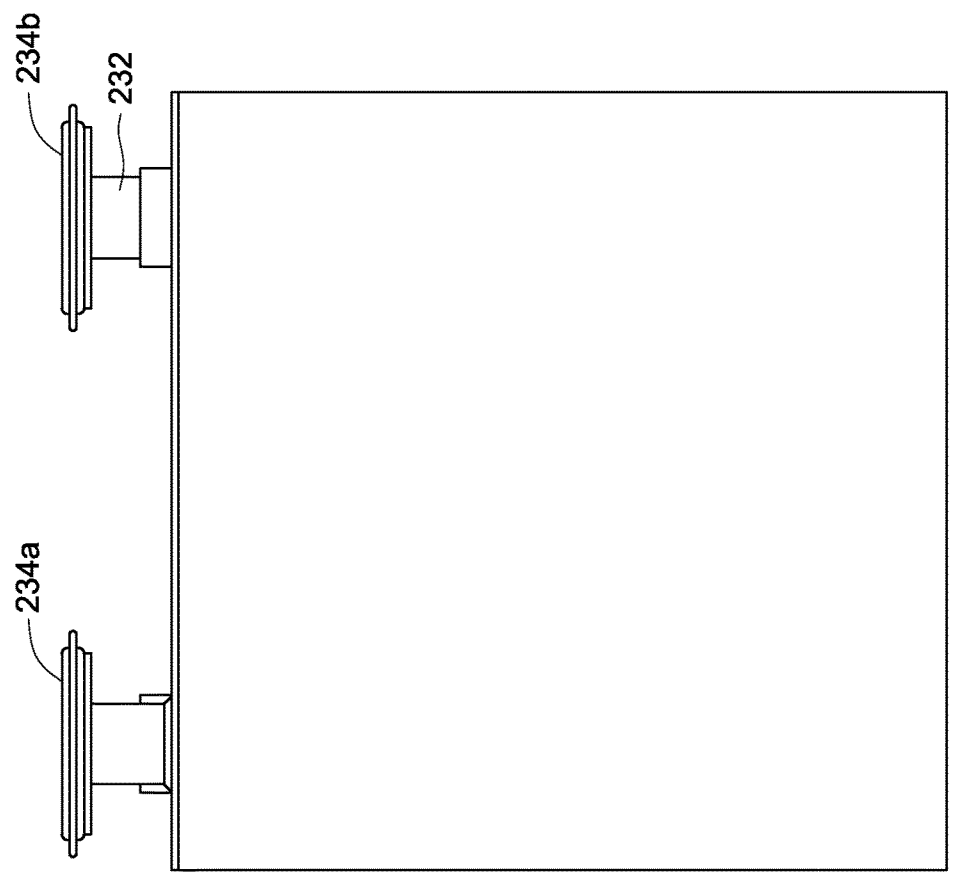
FIG. 23 is an end view of the thermal management system of FIG. 22.

FIGS. 22-23 illustrate another configuration of a thermal management system for cooling and/or heating an electrical device such as a battery. In one embodiment, the thermal management system can have two heat transfer devices 234a, 234b, each of which extends along a top side of the thermoelectric devices (not shown) that are connected to the two generally parallel rows of terminals 232a, 232b. The heat transfer devices 234a and 234b can each extend along one row of terminals 232a, 232b. In some embodiments, the heat transfer devices 234a and 234b or other heat transfer devices can be positioned between the terminals 232a, 232b and the TE devices.

FIGS. 24-28 illustrate another configuration of a thermal management system for cooling and/or heating a power device such as a battery. In some embodiments, one or more heat transfer devices can be positioned or spaced apart from one another as far as possible based on the geometry of the electrical conductors, heat transfer devices, and/or device under thermal management. In some embodiments, at least one heat transfer device can be positioned on a surface of an electrical device that is different from a surface that the electrical conductors protrude from. In some embodiments, at least one heat transfer device is not positioned on the same plane as the electrical conductors of an electrical device. Thermal transfer can occur on a surface perpendicular, normal, non-planar and/or non-parallel to the surface the electrical conductors protrude from. In some embodiments, one or more heat transfer devices 254a and 254b are positioned on two opposing sides of the battery 242. The heat transfer devices 254a and 254b can extend along substantially the entire length or side of the battery 242. One end of the thermoelectric devices 246 can be in substantial thermal communication with at least one terminal 252 of two adjacent cells 244 that are connected in series.

Figure 24:
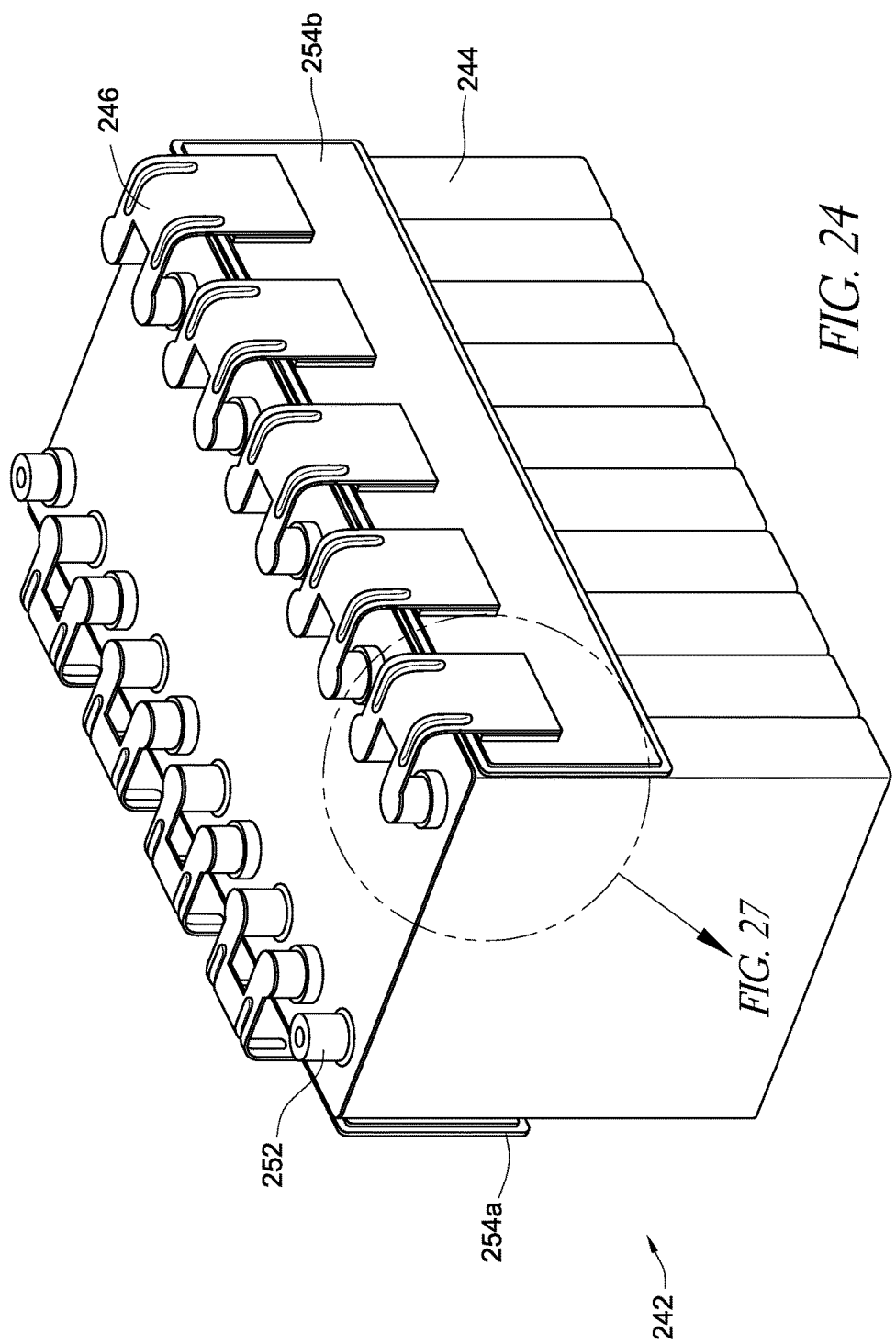
FIG. 24 is a perspective view of another example thermal management system.
Figure 25:
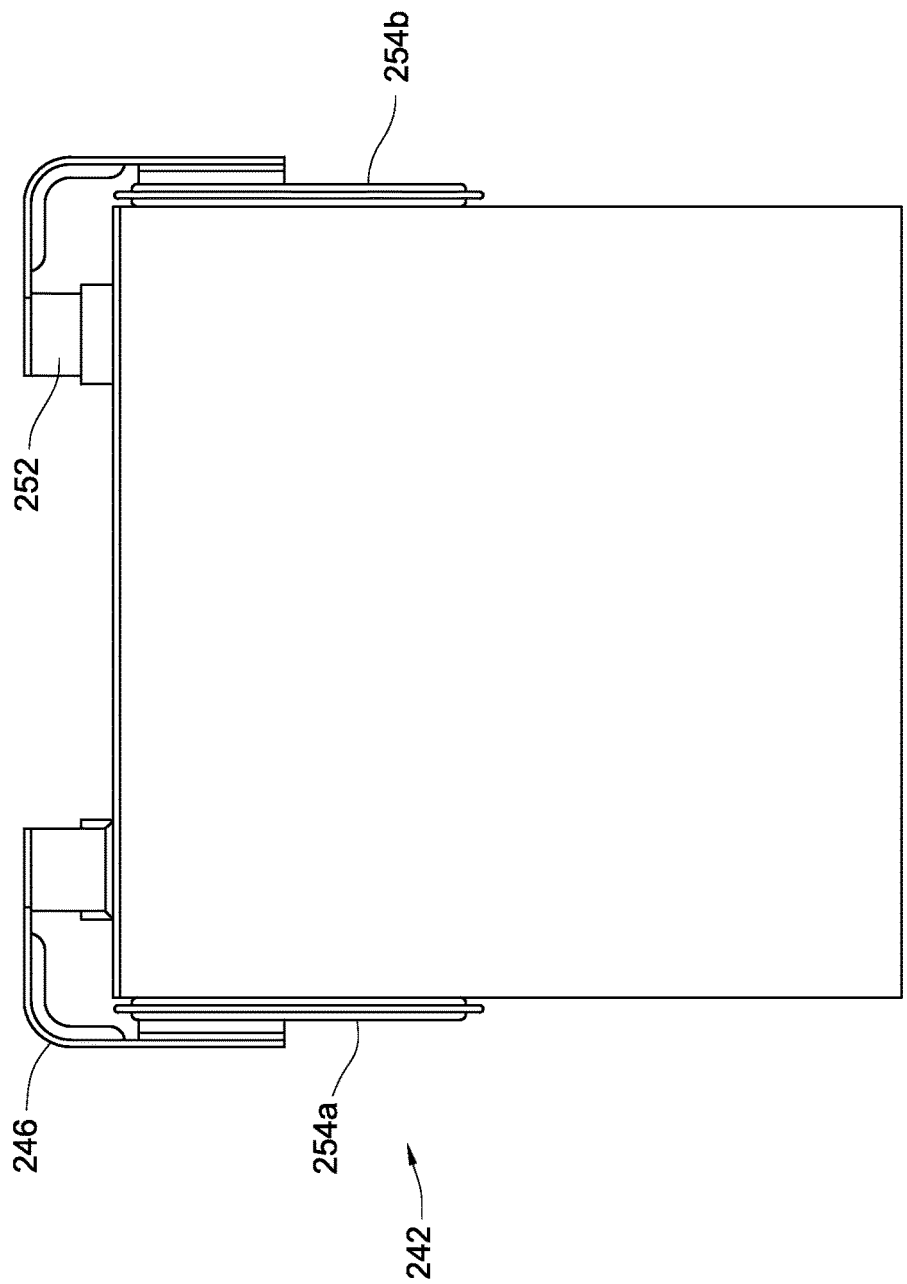
FIG. 25 is an end view of the thermal management system of FIG. 24.
Figure 28:
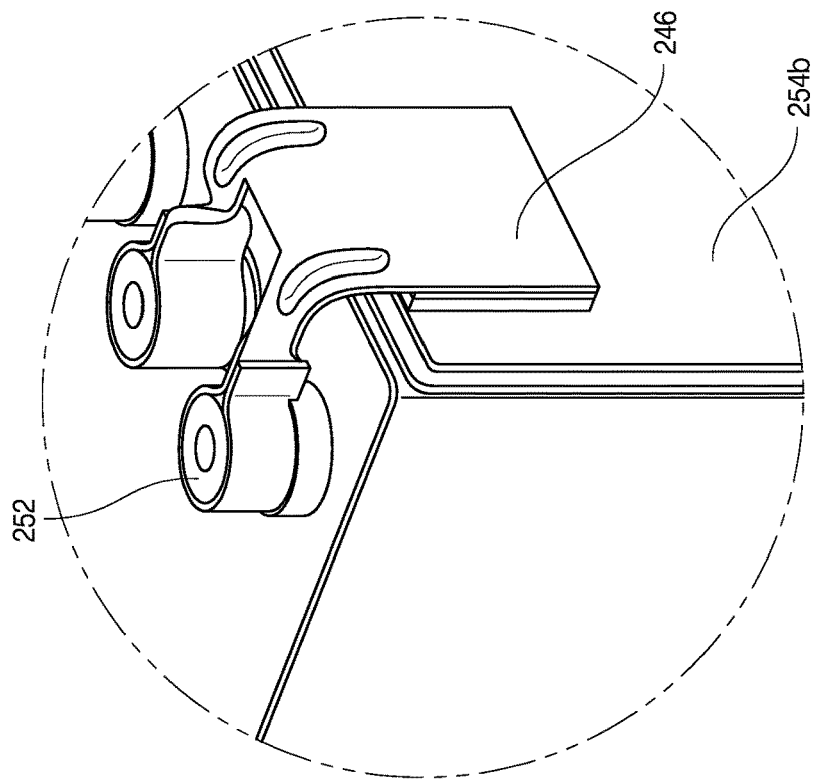
FIG. 28 is a close-up view of a portion of the thermal management system of FIG. 26.
Figure 27:
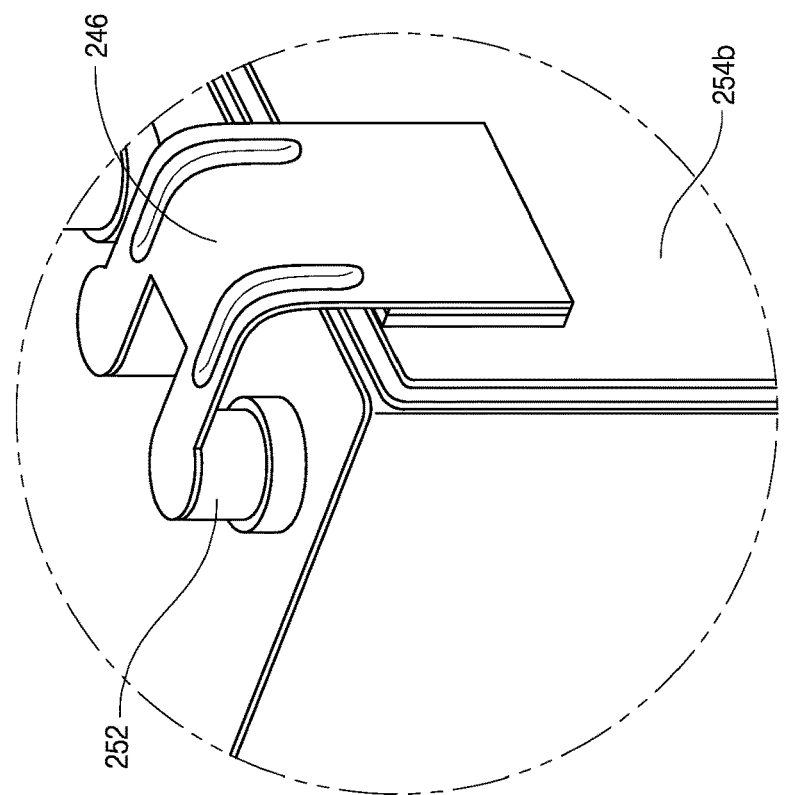
FIG. 27 is a close-up view of a portion of the thermal management system of FIG. 24.

In some embodiments, the ends of the thermoelectric devices 246 can be connected or mounted to the tops of the terminals 252 as illustrated in FIGS. 24-25, and 27. In some embodiments, portions of thermoelectric devices can surround an outer perimeter of an electrical conductor or be mounted to the sides as illustrated in FIGS. 26 and 28. In some embodiments, portions of thermoelectric devices can contact a top surface of an electrode in a substantially planar manner. In some embodiments, an overall height or footprint of a battery module or other electrical device can be maintained or kept substantially equivalent by orienting or connecting structures of a thermal management system in a substantially planar manner with the existing surface or surfaces of electrical conductors or electrical devices.

In some embodiments, the other end of each thermoelectric device 246 can be connected, clipped, and/or clamped to a heat transfer device 254a or 254b. In some embodiments, such a thermal management system configuration can transfer heat to or from the terminals 252 and/or the sides of the battery 242.

In some embodiments, at least some thermal management systems that are described herein can include one or more of the following features:
1. Direct thermal management of power electronics or electrical devices by thermally managing the leads of the devices via a TE device.
2. Indirect lead cooling with heat transfer device connected to a TE device.
3. At least one cooled power lead per TE device.
4. Multiple cooled leads by a single TE device.
5. TE device powered in parallel or in series with the thermally managed device.
6. TE voltage-current design optimized for connecting directly to the battery to minimize the need for extra electronics and to provide a desired amount of cooling for the battery.
7. TE device on the battery side of the disconnect.
8. TE device on the charger cable side of the disconnect.
9. Different polarity TE devices between charger cables and battery side use so that the battery is always being cooled whether it is charged or discharged.
10. Thermal insulator that prevents parasitic flow of heat/cold towards the portion of the electrical circuit outside of the device being thermally managed.
11. A device under thermal management that includes at least two units connected in series. A TE device can be thermally connected to the electrical conductor that connects the two units in series.
12. A plurality of elements connected electrically between each other. At least one TE device can be connected thermally to a plurality of electrical conductors that connect the elements.
13. Battery pack thermal management using one or more of the techniques described above.
14. IGBT thermal management using one or more of the techniques described above.
15. Thermal management of power amplifiers using one or more of the techniques described above.

FIGS. 29-32 illustrate other embodiments of thermal management system configurations for cooling and/or heating electrical devices, e.g. a battery, battery pack, etc., that can comprise or incorporate features and aspects, in whole or in part, of any of the embodiments, features, structures and operating modes discussed herein.

As discussed above, in some embodiments, it can be beneficial to provide thermal management (either heating and/or cooling) to an electrical device to promote efficient operation of the electrical device. For example, heating and cooling an electrical device (e.g. a battery, battery pack, cells of a battery pack, etc.) through electrical conductors (e.g., battery or cell electrodes) can be an efficient way to perform such thermal management. One option to provide distributed and agile thermal management to the cells in a battery pack is to control the flow of heat in and out of the battery by putting thermoelectric devices in thermal communication with one or more battery electrodes as described in certain embodiments herein.

Figure 29:
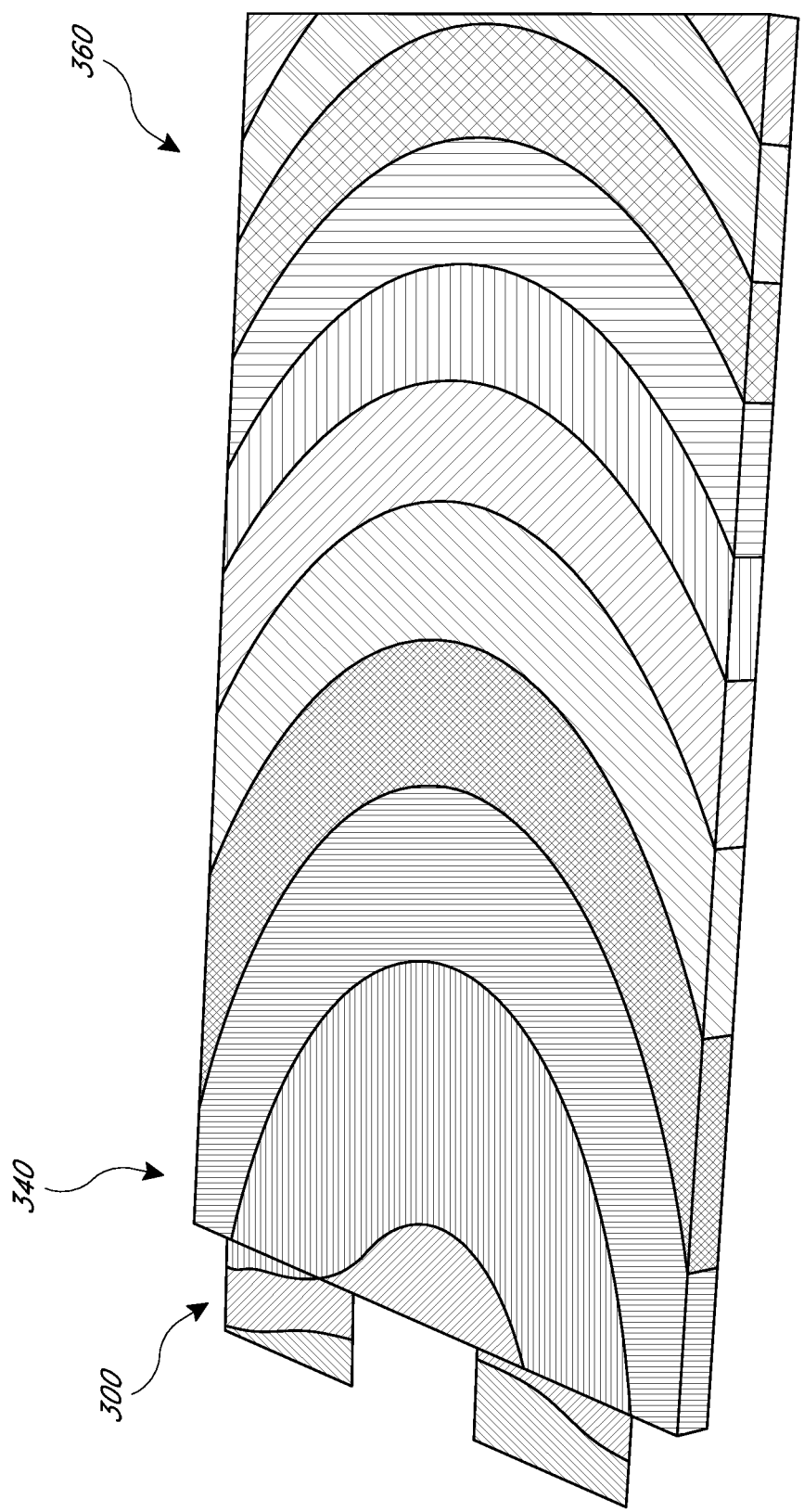
FIG. 29 schematically illustrates an example thermal gradient of a cell of a battery.

Generally, when a cell of a battery or battery pack is operational (e.g., charging or discharging), internal chemical and/or physical processes generate heat in the cell. In certain embodiments, this heat can be distributed inhomogeneously across the cell, resulting in the hottest areas of the cell being closest, in near proximity to, or at the electrodes. For example, such a pattern or thermal gradient was described in S. Chacko, Y. M. Chung/*Journal of Power Sources* 213 (2012) 296-303. A schematic illustration of a simulated profile of the temperature or thermal gradient of a discharging battery from the Chacko Article is shown in FIG. 29. The different hash patterns indicate different temperatures. In some embodiments, as shown in FIG. 29, the temperature gradient of the cell is such that it decreases in a continuous manner from volumes or zones 340 in close proximity to or at the electrodes 300 with the highest temperatures to zones 360 on the end of the cell farthest away from the electrodes with the lowest temperatures. In some embodiments, the temperature gradient is such that the temperature increases from volumes or zones in close proximity to or at the electrodes with the lowest temperatures to zones on the cell farthest away from the electrodes with the highest temperatures.

In some embodiments, temperature or thermal gradients across or within the battery cell or other temperature sensitive region of an electrical device are produced a result of the heat produced, added, or absorbed by the electrochemical process within the cell and by Joule heating during operation (e.g., discharging or charging). Joule heating can result from the operation of a battery which generates heat due to the $I^2R$ losses as current flows through the internal resistance of the battery during charging or discharging.

These are bulk processes occurring in the volume of the cell and diffusion has a large contribution to where in the cell volume the process occurs at a particular time. For example, in some embodiments, when the cell is close to full charge, the discharge will begin close to or in near proximity to the electrodes. In such embodiments, more heat is produced closer to the electrodes, resulting in higher temperatures at or near these electrodes than regions or zones of the cell farther away from the electrodes. Conversely, in some embodiments, when the battery is close to depletion, the zones farthest away from electrodes are the warmest or have higher temperatures relative to the zones near the electrodes because they have not discharged yet.

Additionally, in some embodiments, when a cell of a battery or region of another electrical device is heated or cooled through or via the electrodes, a thermal gradient can also be established across the cell or region. For example, if the electrodes are cooled (i.e. thermal energy is extracted from the cell), the volume, zone, region, etc. of the cell that is closest or in near proximity to the electrodes is cooled the most. If the rate of heat extraction from the cell is significantly higher than the rate of heat production in the cell (caused by physical and/or chemical processes occurring when the cell is operational as discussed above) then a thermal gradient will develop in the cell. The areas proximal to the electrodes will be coldest while the areas distal to the electrodes will be the warmest. For example, in one embodiment, 20 W of heat was pumped out of a pouch cell (e.g., Actacell, 5 A-h power cell), leading to the creation of a thermal gradient across the cell of 13 degrees C. Conversely, if the electrodes are heated, an inverse gradient may be established, where the areas proximal to the electrodes are the warmest and the areas distal to the electrodes are the coldest.

In some embodiments, the gradation of thermal energy is not a discrete variation but a continuous thermal gradient across the cell of the battery or region of the electrical device. Thermal gradients can reduce cell life, capacity and long-term cycling ability. In some embodiments, it is beneficial to eliminate, minimize, or reduce such gradients.

In some embodiments, combining the two effects (gradients created by cooling and/or heating through electrodes and gradients created during electrical or battery operation (e.g., due to electrochemical process, Joule heating, etc)) so that the gradients balance or counter-act one another can result in a cell of a battery or region of an electrical device wherein the net, overall and/or resultant thermal gradient is eliminated, minimized, or reduced. In some embodiments, the thermal management system is configured to control the thermal gradient across or within the region of the electrical device such that the thermal gradient remains less than or equal to about 2° C., less than or equal to about 10° C., or less than or equal to about 30° C.

One example of combining thermal gradients produced by operation and thermal management of an electrical device such that the net, resulting or overall thermal gradient reduction is reduced or minimized is schematically illustrated in FIG. 30. The first drawing on the left in FIG. 30 schematically illustrates a simplified view of a thermal gradient created by heat generated in a battery cell by internal processes (e.g., electrochemical, Joule heating, etc.) during operation. The thermal gradient or variation in localized temperatures indicated by different hatching patterns across the cell of the battery, illustrate that in some embodiments, the highest temperatures are near the electrode and the lowest temperatures in regions farthest away from the electrode. The middle drawing of FIG. 30 schematically illustrates a simplified view of a thermal gradient that is produced by controlled cooling of an electrical device via an electrode of the cell which is in thermal communication with a thermoelectric device. The thermal gradient is inverse relative to that of the thermal gradient in the first drawing with the highest temperatures in regions of the cell farthest away from the electrode and lowest temperatures near the electrode as illustrated by different hatching patterns. Combining the two effects or thermal gradients, results in a cell or region of an electrical device with an overall or net thermal gradient reduced, minimized or eliminated as illustrated in right drawing of FIG. 30.

Figure 31:
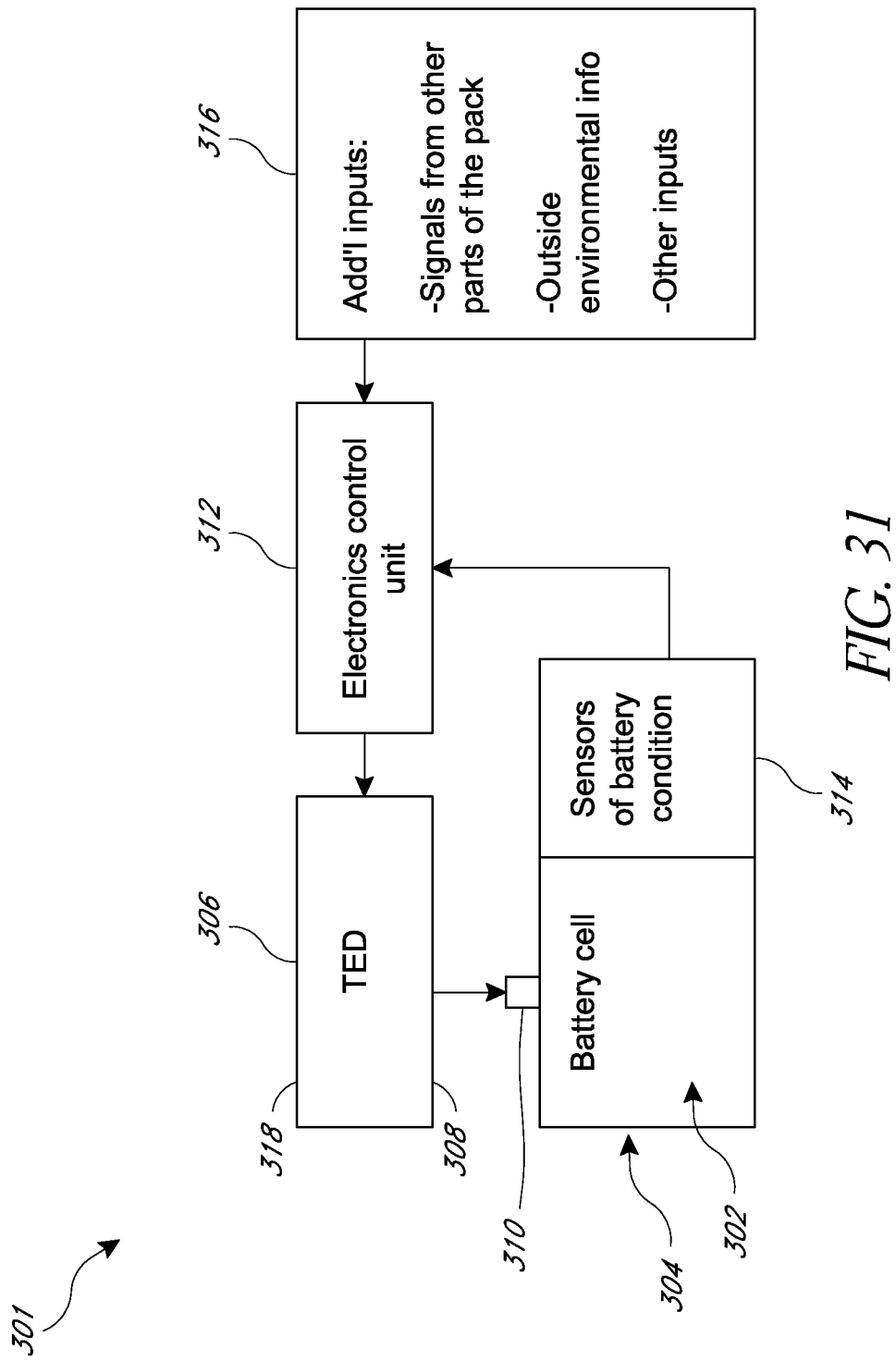
FIG. 31 schematically illustrates an example thermal management system.

Referring now to FIG. 31, an embodiment of a thermal management system 301 is provided that can comprise various features and advantages of the aforementioned embodiments (e.g., as illustrated in FIGS. 1-28), as well as other features discussed herein. Thermal management system 301 can be configured to provide controlled cooling and/or heating to reduce, minimize, or eliminate thermal gradients, localized hotspots, and/or cold spots formed across or within a temperature sensitive region of an electrical device (e.g., cell of a battery, etc.) The thermal management system 301 can be configured such that it comprises a controlled cooling and/or heating system that accounts for uneven distribution of generated heat, temperature effects, and/or thermal hotspots and cold spots in an electrical device as a result of internal heating produced during operation, ambient temperatures, and/or geometry of the region. The controlled cooling and/or heating system can account for such variables along with other electrical aspects that produce uneven temperature distribution or thermal gradients across the region of the electrical device. The thermal management system 301 can apply controlled cooling and/or heating as necessary or that is adequate to counteract, account for or balance any such thermal gradient or temperature distribution. In some embodiments, the thermal management system can apply or provide controlled cooling and/or heating that produces an inverse thermal gradient across the region of the electrical device that counteracts or balances the thermal gradient produced during operation of the electrical device.

In some embodiments, as illustrated in FIG. 31, a thermal management system 301 can be configured to manage temperature in a temperature-sensitive region 302 of an electrical device 304. The system 301 can comprise a thermoelectric device 306 configured to transfer thermal energy between a main surface 308 and a waste surface 318 of the thermoelectric device upon application of electric power to the thermoelectric device 306. The main surface 308 of the thermoelectric device can be in substantial thermal communication with an electrical conductor 310. The electrical conductor 310 is configured to deliver electric power to or from the electrical device 304 such that the electrical conductor 310 serves as a conduit for conducting thermal energy between the temperature-sensitive region 302 of the electrical device 304 and the thermoelectric device 306. As discussed and illustrated in other embodiments, the electrical device 304 can be, but is not limited to, a battery, battery pack, etc. The temperature sensitive region 302 can be, but is not limited to, a cell or cells of a battery. In some embodiments, the electrical conductor 310 can be an electrode of a battery or cell. The thermoelectric device can contact or abut the electrical conductor 310 or a heat transfer device that is thermal communication with the electrical conductor as discussed above with respect to certain embodiments.

In some embodiments, the thermal management system 301 can comprise a controller or control system 312 (e.g., but not limited to, an electronic control unit that can comprise various features and advantages of the aforementioned embodiments discussed above, as well as other features discussed herein) configured to adjust electric power delivered to the thermoelectric device 306 such that the thermal energy transferred to or away (e.g., heating and/or cooling) from the temperature-sensitive region 302 of the electrical device 304 via the electrical conductor 310 reduces, minimizes or eliminates a thermal gradient created during operation of the electrical device 304 across the temperature sensitive region 302.

As discussed above, in some embodiments, the controller or control system 312 can adjust the electric power level (e.g., voltage and/or current, etc.) delivered to or away from the thermoelectric device 306 such that the thermal energy transferred to or away from the temperature-sensitive region 302 of the electrical device 304 produces a thermal gradient across or within the region. In some embodiments, the electric power directed to or away from the thermoelectric device is adjusted between two or more nonzero levels of current and/or voltage. The controller or control system 312 can be configured (e.g., with a control algorithm) such that the thermal gradient produced as a result of the heating and/or cooling of the region counterbalances or combines with a thermal gradient produced during operation of the electrical device 304 such that a resulting, net or overall thermal gradient of the electrical device is eliminated or reduced as illustrated in simplified views in FIG. 30.

In some embodiments, the thermal handling capacity of the thermoelectric device is designed or configured to be adequate to remove the heat produced in a cell or region of an electrical device during operation. The thermoelectric management system 301 can comprise a controller or control system 312 (e.g., electronic control unit, etc) that regulates the operation of the thermoelectric device 306 in response to the thermal condition of the cell, its current mode of operation, the inputs from pack-level signals, inputs from a sensor and/or other inputs as described herein. As a result, the thermoelectric device 306 can pump away the heat produced in a cell, thereby neutralizing, minimizing, reducing or eliminating the thermal gradient produced by cell operation. In some embodiments, the thermoelectric device 306 can pump heat to the cell as necessary to reduce a thermal gradient.

In some embodiments, the controller or control system 312 can comprise an electronic control unit that provides real time control of the thermoelectric device 306 so that the heat pumping rate (either to or away) of the thermoelectric device 306 responds to the heat production rate of the cell to reduce, minimize, or eliminate a thermal gradient. Additionally, the control algorithm may incorporate a variety of other inputs 316 to be monitored by the controller 312, including, for example:

state of charge, state of health, voltage, temperature, resistance or combination of these and other operational parameters of the electrical device, battery pack, module or individual cell;

performance of the thermoelectric device as a function of operational parameters (for example, a thermoelectric device may be operated in the most efficient mode or the most powerful mode depending on the needs of the battery);

outside environmental information such as temperature, time of day, season, weather forecast;

terrain information (for example, driving in the mountains creates extra load on the battery which can be anticipated if terrain information is supplied from on-board GPS);

The electronic control unit may be a standalone electronic circuit, or it could be a part of the overall Battery Management System, BMS;

Geometry of the temperature-sensitive region to be managed

In some embodiments, as discussed above the thermoelectric device 306 and/or the controller 312 (e.g., electronic control unit) may be fully or partially powered by the exact cell or electrical device of which thermal condition is being managed as illustrated in FIG. 4. In other embodiments, the electric power may be provided from other sources such as an external power supply as discussed above with aforementioned embodiments as illustrated in FIG. 5.

In some embodiments, the thermoelectric management system 301 can comprise a sensor(s) 314 with one or more features as discussed above with respect to FIGS. 4-5. As illustrated in FIG. 31, the sensor(s) 314 can be in thermal communication with the electrical device 304 and in electrical communication with the controller 312 and provide any of the inputs as described above to be monitored by the controller or control system 312. Inputs or signals 316 from other sensors (not shown) can also be provided to the controller or control system 312 to be monitored as part of a control algorithm to provide sufficient heating and/or cooling to reduce, minimize or eliminate a thermal gradient or other uneven temperature distribution.

In some embodiments, the heat pumping capacity of a thermoelectric device attached to the electrodes is a function of the battery type and its construction, as well as construction of the battery pack. A typical pouch cell of several A-h electric power capacity can require a thermoelectric device with heat pumping capacity between 1 and 10 W.

The thermal management system 301 can comprise any of the features as discussed above in the aforementioned embodiments. For example, the thermal management system 301 can be combined with the independent control features illustrated and described with respect to FIG. 16. Individual cells and/or regions of the battery or electrical device can be thermally managed independently. In some embodiments, different regions will have different thermal gradients and thus will need independent control such that the appropriate or sufficient heating and/or cooling is provided to reduce or eliminate any thermal gradient produced or created during operation. In some embodiments, each region or cell can be monitored by or be in communication with one or more different sensors. In some embodiments, one or more sensors can monitor or be in communication with one or more regions or cells. In some embodiments, the thermal management system can comprise bulk monitoring wherein the thermal condition of the entire battery or electrical device is monitored by one or more sensors. In some embodiments, one or more sensors can provide a report of the thermal condition or other input of the entire electrical device or battery to the controller. Additionally, the thermal management system 301 can be combined with, but is not limited to, any of the configurations illustrated in FIGS. 20-28.

Figure 32:
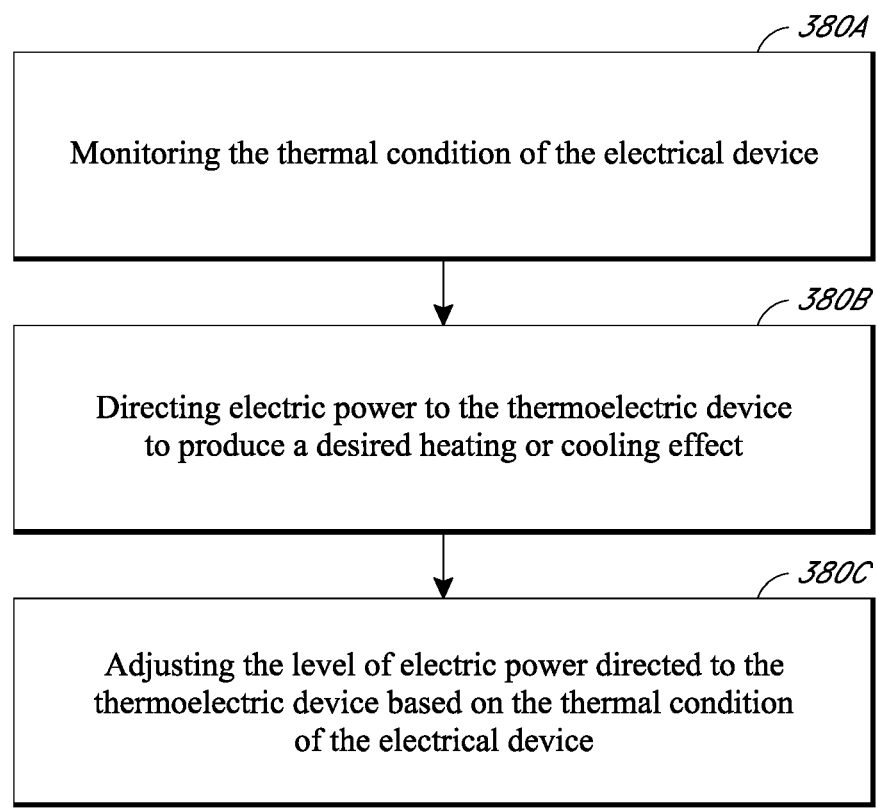
FIG. 32 illustrates an example method for controlling heating and/or cooling provided to an electrical device by a thermal management system.

In some embodiments, as illustrated in FIG. 32, steps 380A-380C for thermally managing an electrical device are provided. The electrical device can have electrical conductors (e.g., electrodes, etc.) connected to a thermoelectric device. The first step 380A can comprise monitoring the thermal condition of the electrical device as a whole, in part, or individual cells or regions independently. The second step 380B can comprise directing electrical power (e.g., voltage and/or current, etc.) to the thermoelectric device to produce a desired heating and/or cooling effect. The third step 380C can comprise adjusting the level of electric power directed to the thermoelectric device based on the thermal condition of the electric device. In some embodiments, the steps can comprise establishing substantial thermal communication between a thermoelectric device and an electrical conductor that is in thermal and electrical communication with a temperature-sensitive region of the electrical device. The steps can comprise monitoring inputs provided by a sensor in thermal communication with the region of the electrical device and electrical communication with a controller that is provided to monitor the inputs. The steps can comprise adjusting the electric power (e.g., voltage and/or current, etc.) directed in or out of the thermoelectric device in response to the inputs to reduce or eliminate a thermal gradient created during operation of the electrical device across the temperature-sensitive region. These steps can be repeated or cycled as the electrical device continues operating. In some embodiments, these steps can continue even after operation if a thermal gradient still exists due to residual heat in the electrical device.

In some embodiments, a method of thermally managing an electrical device is provided that comprises connecting a thermoelectric device to a control system for thermally managing an electrical device, placing the thermoelectric device in thermal communication with an electrical conductor of the electrical device, and connecting a sensor to the control system and the electrical device.

Discussion of the various embodiments herein has generally followed the embodiments schematically illustrated in the figures. However, it is contemplated that the particular features, structures, or characteristics of any embodiments discussed herein may be combined in any suitable manner in one or more separate embodiments not expressly illustrated or described. In many cases, structures that are described or illustrated as unitary or contiguous can be separated while still performing the function(s) of the unitary structure. In many instances, structures that are described or illustrated as separate can be joined or combined while still performing the function(s) of the separated structures.

Various embodiments have been described above. Although the inventions have been described with reference to these specific embodiments, the descriptions are intended to be illustrative and are not intended to be limiting. Various modifications and applications may occur to those skilled in the art without departing from the spirit and scope of the inventions described herein.

What is claimed is:

1. A thermal management system configured to manage temperature in a temperature-sensitive region of an electrical device, the system comprising:
   a thermoelectric device configured to transfer thermal energy between a main surface and a waste surface upon application of electric power to the thermoelectric device, wherein the main surface of the thermoelectric device is in thermal communication with a temperature-sensitive region of an electrical device;
   a plurality of sensors configured to provide inputs corresponding to a thermal gradient created during operation of the electrical device across the temperature-sensitive region; and
   a controller programmed, during operation of the electrical device, to:
      receive the inputs from the plurality of sensors to monitor the thermal gradient created during operation of the electrical device across the temperature-sensitive region;
      adjust electric power delivered to the thermoelectric device based on the thermal gradient such that thermal energy transferred to or away from the temperature-sensitive region of the electrical device reduces or eliminates the thermal gradient created during operation of the electrical device across the temperature-sensitive region;
      monitor electric current directed in or out of the electrical device; and
      adjust electric power delivered to the thermoelectric device to reduce or eliminate the thermal gradient created during operation of the electrical device across the temperature-sensitive region at least in part based on the electric current directed in or out of the electrical device.

2. The thermal management system of claim 1, further comprising a plurality of thermoelectric devices in thermal communication with a plurality of temperature-sensitive regions of the electrical device, wherein a main surface of each thermoelectric device of the plurality of thermoelectric devices is in substantial thermal communication with a corresponding temperature-sensitive region of the plurality of temperature-sensitive regions, and wherein the controller is programmed to independently adjust electric power delivered to each thermoelectric device based on a thermal gradient created during operation of the electrical device across the corresponding temperature-sensitive region such that the thermal energy transferred to or away from the corresponding temperature-sensitive region of the electrical device reduces or eliminates the thermal gradient created during operation of the electrical device across the corresponding temperature-sensitive region.

3. The thermal management system of claim 1, wherein electric power delivered to the thermoelectric device to reduce or eliminate the thermal gradient created during operation of the electrical device across the temperature-sensitive region is adjusted between two or more nonzero levels of electric power.

4. The thermal management system of claim 1, wherein the controller is further programmed to monitor a thermal gradient produced as a result of the thermal energy transferred to or away from the temperature-sensitive region of the electrical device and to adjust electric power delivered to the thermoelectric device such that the thermal gradient produced as a result of the thermal energy transferred to or away from the temperature-sensitive region of the electrical device reduces or eliminates the thermal gradient created during operation of the electrical device across the temperature-sensitive region.

5. The thermal management system of claim 1, wherein the thermoelectric device comprises a first operating mode and a second operating mode, wherein in the first operating mode, the thermoelectric device is configured to transfer a maximum amount of thermal energy allowed by the thermoelectric device, and wherein in the second operating mode, the thermoelectric device is configured to transfer an amount of thermal energy different from the maximum amount such that a thermal gradient created by the transfer of thermal energy balances with the thermal gradient created during operation of the electrical device across the temperature-sensitive region to reduce or eliminate a resultant thermal gradient across the temperature-sensitive region.

6. The thermal management system of claim 1, wherein the controller is further programmed to monitor at least one of: temperature of the electrical device, charge state of the electrical device, health of the electrical device, voltage of the electrical device, resistance of the electrical device, load on the electrical device, temperature of an environment, weather forecast, time of day, terrain information, and geometry of the temperature-sensitive region.

7. The thermal management system of claim 1, wherein the controller is integrated with a battery management system configured to administer control functions to a battery pack.

8. The thermal management system of claim 1, wherein the electrical device comprises a battery, and the temperature-sensitive region is a cell of the battery.

9. The thermal management system of claim 1, wherein the thermal gradient across the temperature-sensitive region of the electrical device is reduced to less than or equal to about 10 degrees C. during operation of the electrical device.

10. The thermal management system of claim 1, wherein the thermoelectric device is configured to be powered by the electrical device.

11. The thermal management system of claim 1, wherein the controller is further programmed to adjust electric power delivered to the thermoelectric device based on the thermal gradient created during operation of the electrical device to reduce or eliminate the thermal gradient created during operation of the electrical device across the temperature-sensitive region.

12. The thermal management system of claim 1, wherein the thermal gradient created during operation of the electrical device across the temperature-sensitive region of the electrical device continually decreases in temperature from a zone of the electrical device proximate to an electrical conductor of the electrical device to a zone of the electrical device farthest away to the electrical conductor, and wherein a thermal gradient produced as a result of the thermal energy transferred to or away from the temperature-sensitive region of the electrical device continually increases in temperature from the zone of the electrical device proximate to the electrical conductor to the zone of the electrical device farthest away to the electrical conductor to reduce or eliminate the thermal gradient created during operation of the electrical device across the temperature-sensitive region.

13. The thermal management system of claim 12, wherein the electrical device comprises a battery cell, and wherein the thermal gradient created during operation of the electrical device across the temperature-sensitive region of the electrical device continually decreases in temperature to the thermal gradient produced as a result of the thermal energy transferred to or away from the temperature-sensitive region of the electrical device increasing in temperature when the battery cell is substantially at full charge.

14. The thermal management system of claim 12, wherein the thermal gradient produced as a result of the thermal energy transferred to or away from the temperature-sensitive region of the electrical device increases inversely to the thermal gradient created during operation of the electrical device across the temperature-sensitive region of the electrical device decreasing.

15. The thermal management system of claim 1, wherein the thermal gradient created during operation of the electrical device across the temperature-sensitive region of the electrical device continually increases in temperature from a zone of the electrical device proximate to an electrical conductor of the electric device to a zone of the electrical device distal to the electrical conductor, and wherein a thermal gradient produced as a result of the thermal energy transferred to or away from the temperature-sensitive region of the electrical device continually decreases in temperature from the zone of the electrical device proximate to the electrical conductor to the zone of the electrical device distal to the electrical conductor to reduce or eliminate the thermal gradient created during operation of the electrical device across the temperature-sensitive region.

16. The thermal management system of claim 15, wherein the electrical device comprises a battery cell, and wherein the thermal gradient created during operation of the electrical device across the temperature-sensitive region of the electrical device continually increases in temperature to the thermal gradient produced as a result of the thermal energy transferred to or away from the temperature-sensitive region of the electrical device decreasing in temperature when the battery cell is substantially at depletion.

17. The thermal management system of claim 15, wherein the thermal gradient produced as a result of the thermal energy transferred to or away from the temperature-sensitive region of the electrical device decreases substantially inversely to the thermal gradient created during operation of the electrical device across the temperature-sensitive region of the electrical device increasing.

18. The thermal management system of claim 1, wherein the thermal gradient created during operation of the electrical device across the temperature-sensitive region of the electrical device continually changes in temperature from a zone of the electrical device proximate to an electrical conductor of the electric device to a zone of the electrical device distal to the electrical conductor inversely to a continual change in temperature from the zone of the electrical device proximate to the electrical conductor to the zone of the electrical device distal to the electrical conductor associated with a thermal gradient produced as a result of the thermal energy transferred to or away from the temperature-sensitive region of the electrical device.

19. The thermal management system of claim 1, wherein the main surface of the thermoelectric device is in substantial thermal communication with an electrical conductor of the electrical device, wherein the electrical conductor is configured to deliver electric power to or from the electrical device, and wherein the electrical conductor is capable of serving as a conduit for conducting thermal energy between the temperature-sensitive region of the electrical device and the thermoelectric device.

20. The thermal management system of claim 19, wherein two or more electrical conductors comprise the electrical conductor, and wherein the two or more electrical conductors are positioned on a same surface of the electrical device.

21. A thermal management system configured to manage temperature of an electrical device, the system comprising:
a thermoelectric device configured to transfer thermal energy between a main surface and a waste surface via electric power applied to the thermoelectric device, wherein the main surface of the thermoelectric device is in thermal communication with of an electrical conductor of an electrical device, the electrical conductor configured to deliver electric power to or from the electrical device;
a plurality of sensors configured to provide inputs corresponding to a thermal gradient of the electrical device; and
a controller programmed to:
receive the inputs from the plurality of sensors to monitor the thermal gradient of the electrical device;
adjust electric power delivered to the thermoelectric device based on the thermal gradient such that thermal energy transferred to or away from the electrical device reduces or eliminates the thermal gradient of the electrical device;
monitor electric current directed in or out of the electrical device; and
adjust electric power delivered to the thermoelectric device to reduce or eliminate the thermal gradient of the electrical device created during operation of the electrical device at least in part based on the electric current directed in or out of the electrical device.

22. The thermal management system of claim 21, further comprising a plurality of thermoelectric devices in thermal communication with a plurality of electrical conductors of the electrical device, the plurality of electrical conductors comprising the electrical conductor, wherein a main surface of each thermoelectric device of the plurality of thermoelectric devices is in substantial thermal communication with a corresponding electrical conductor of the plurality of electrical conductors, and wherein the controller is programmed to independently adjust electric power delivered to each thermoelectric device based on a thermal gradient across the electrical device such that the thermal energy transferred to or away from the corresponding electrical conductors of the electrical device reduces or eliminates the thermal gradient of the electrical device.

23. The thermal management system of claim 21, wherein the electrical device comprises a battery cell, and the controller is programmed to adjust electric power delivered to the thermoelectric device such that thermal energy transferred to or away from the electrical device reduces or eliminates the thermal gradient across the battery cell.

24. A thermal management system configured to manage temperature of an electrical device, the system comprising:
  a plurality of thermoelectric devices each configured to transfer thermal energy between a main surface and a waste surface via electric power applied to the thermoelectric device, wherein the main surface of each thermoelectric device is in thermal communication with of one or more electrical conductors of an electrical device; and
  a controller programmed to:
    monitor a thermal gradient of the electrical device;
    adjust electric power delivered to the plurality of thermoelectric devices based on the thermal gradient such that thermal energy transferred to or away from the electrical device reduces or eliminates the thermal gradient of the electrical device;
    monitor electric current directed in or out of the electrical device; and
    adjust electric power delivered to the plurality of thermoelectric devices to reduce or eliminate the thermal gradient of the electrical device created during operation of the electrical device at least in part based on the electric current directed in or out of the electrical device.

25. A thermal management system configured to manage temperature of a battery cell, the system comprising:
  a thermoelectric device configured to transfer thermal energy between a main surface and a waste surface via electric power applied to the thermoelectric device, wherein the main surface of the thermoelectric device is in thermal communication with an electrical conductor of a battery cell;
  a sensor configured to provide an input corresponding to a thermal gradient of the battery cell; and
  a controller programmed to:
    receive the input from the sensor to monitor the thermal gradient of the battery cell;
    adjust electric power delivered to the thermoelectric device based on the thermal gradient such that thermal energy transferred to or away from the battery cell reduces or eliminates the thermal gradient of the battery cell;
    monitor electric current directed in or out of the battery cell; and
    adjust electric power delivered to the thermoelectric device to reduce or eliminate the thermal gradient of the battery cell created during operation of the battery cell at least in part based on the electric current directed in or out of the battery cell.

* * * * *